(12) United States Patent
Guler

(10) Patent No.: US 10,522,402 B2
(45) Date of Patent: Dec. 31, 2019

(54) GRID SELF-ALIGNED METAL VIA PROCESSING SCHEMES FOR BACK END OF LINE (BEOL) INTERCONNECTS AND STRUCTURES RESULTING THEREFROM

(71) Applicant: Intel Corporation, Santa Clara, CA (US)

(72) Inventor: Leonard P. Guler, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/770,465

(22) PCT Filed: Dec. 16, 2015

(86) PCT No.: PCT/US2015/066172
§ 371 (c)(1),
(2) Date: Apr. 23, 2018

(87) PCT Pub. No.: WO2017/105445
PCT Pub. Date: Jun. 22, 2017

(65) Prior Publication Data
US 2018/0308754 A1 Oct. 25, 2018

(51) Int. Cl.
*H01L 21/768* (2006.01)
*H01L 21/311* (2006.01)
*H01L 21/033* (2006.01)

(52) U.S. Cl.
CPC .... *H01L 21/76897* (2013.01); *H01L 21/0337* (2013.01); *H01L 21/31144* (2013.01);
(Continued)

(58) Field of Classification Search
None
See application file for complete search history.

(56) References Cited

U.S. PATENT DOCUMENTS 9,659,860 B2 * 5/2017 Schenker ............ H01L 21/0337
2012/0235211 A1 9/2012 Sills et al.
(Continued)

FOREIGN PATENT DOCUMENTS

WO WO-2015026342 A1 * 2/2015 ......... H01L 21/0337

OTHER PUBLICATIONS

International Preliminary Report on Patentability for International Patent Application No. PCT/US2015/066172, dated Jun. 28, 2018, 7 pages.
(Continued)

*Primary Examiner* — Bo B Jang
(74) *Attorney, Agent, or Firm* — Schwabe, Williamson & Wyatt, P.C.

(57) ABSTRACT

Grid self-aligned metal via processing schemes for back end of line (BEOL) interconnects are described. In an example, a method of fabricating an interconnect structure for a semiconductor die includes forming a lower metallization layer including alternating metal lines and dielectric lines above a substrate, the dielectric lines raised above the metal lines. A hardmask layer is formed on the metal lines of the lower metallization layer, between and co-planar with the dielectric lines of the lower metallization layer. A grating structure is formed above and orthogonal to the alternating metal lines and dielectric lines of the lower metallization layer. A mask is formed above the grating structure. Select regions of the hardmask layer are removed to expose select regions of the metal lines of the lower metallization layer. Metal vias are formed on the select regions of the metal lines of the lower metallization layer.

25 Claims, 21 Drawing Sheets

(52) U.S. Cl.
CPC .. *H01L 21/76808* (2013.01); *H01L 21/76811* (2013.01); *H01L 21/76816* (2013.01); *H01L 21/31111* (2013.01)

(56) References Cited

U.S. PATENT DOCUMENTS

| | | |
|---|---|---|
| 2013/0084673 A1 | 4/2013 | Lee et al. |
| 2013/0244344 A1 | 9/2013 | Malmhall et al. |
| 2015/0093702 A1 | 4/2015 | Nyhus et al. |
| 2015/0171010 A1 | 6/2015 | Bristol et al. |

OTHER PUBLICATIONS

International Search Report and Written Opinion for International Patent Application No. PCT/US2015/066172 dated Aug. 19, 2016, pgs.

\* cited by examiner

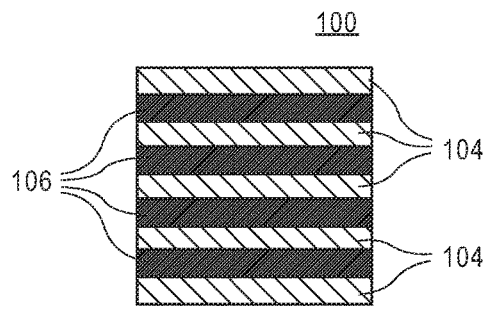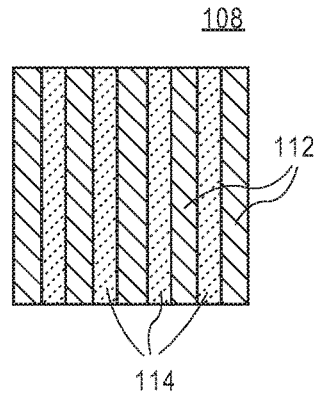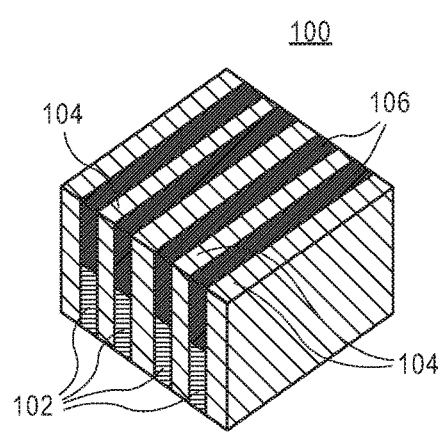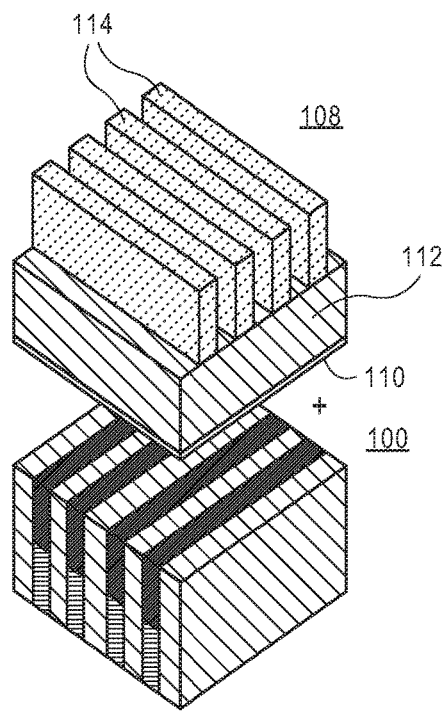
FIG. 1A  FIG. 1B

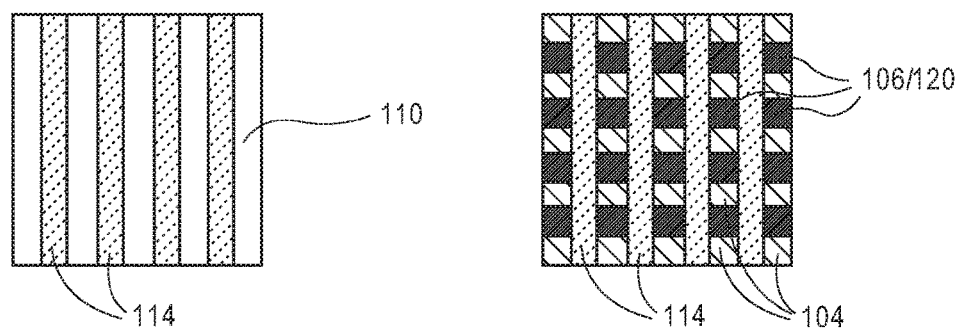
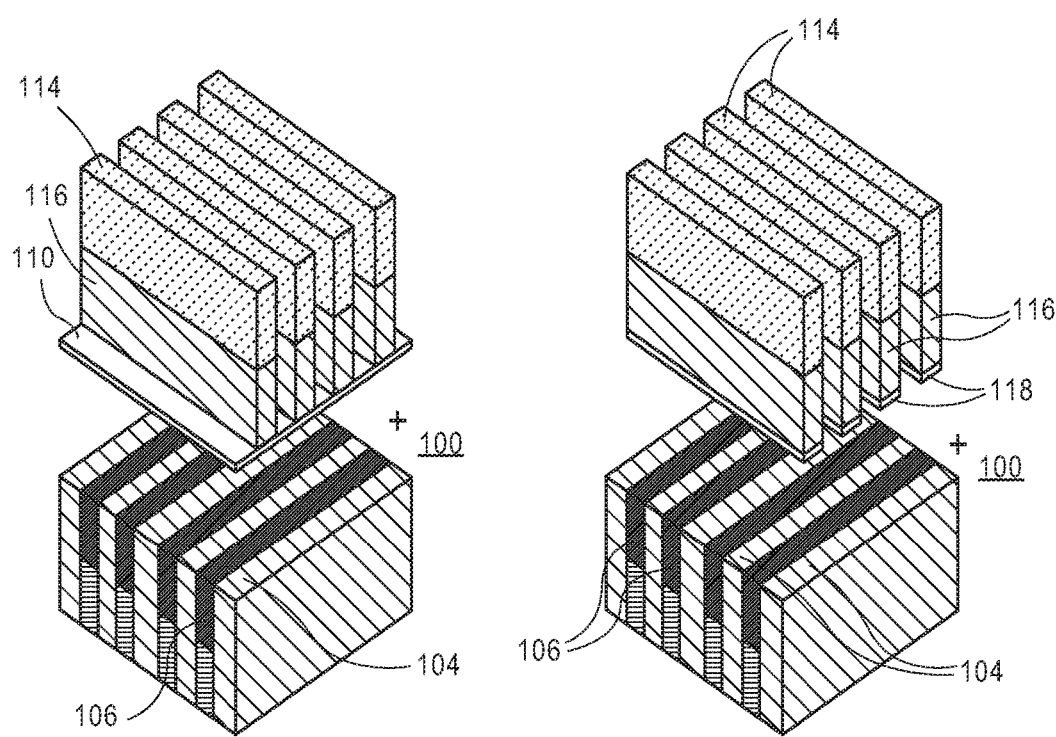
FIG. 1C  FIG. 1D

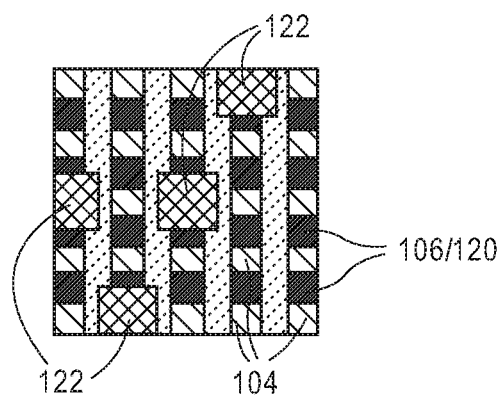
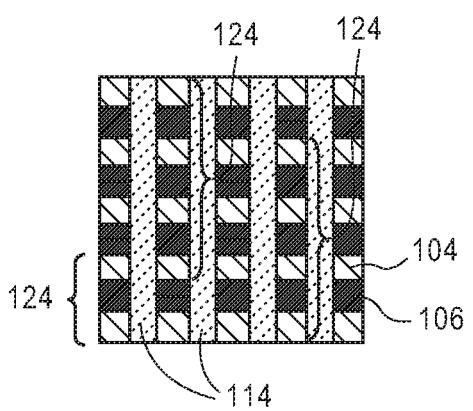
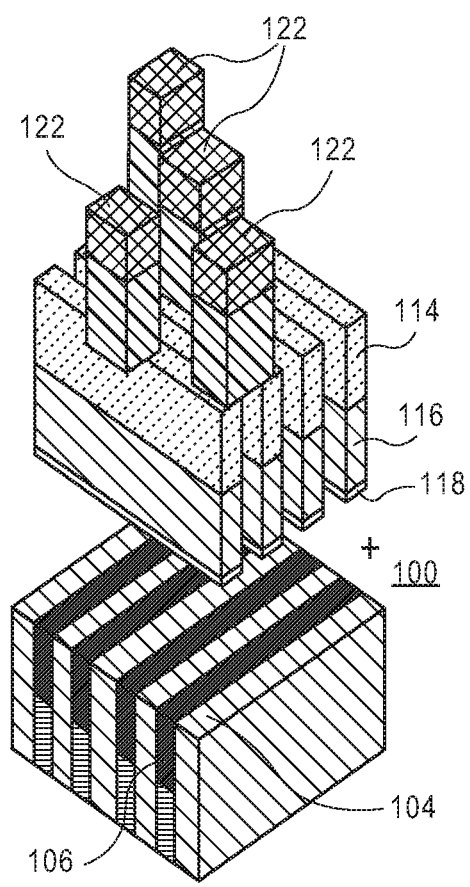
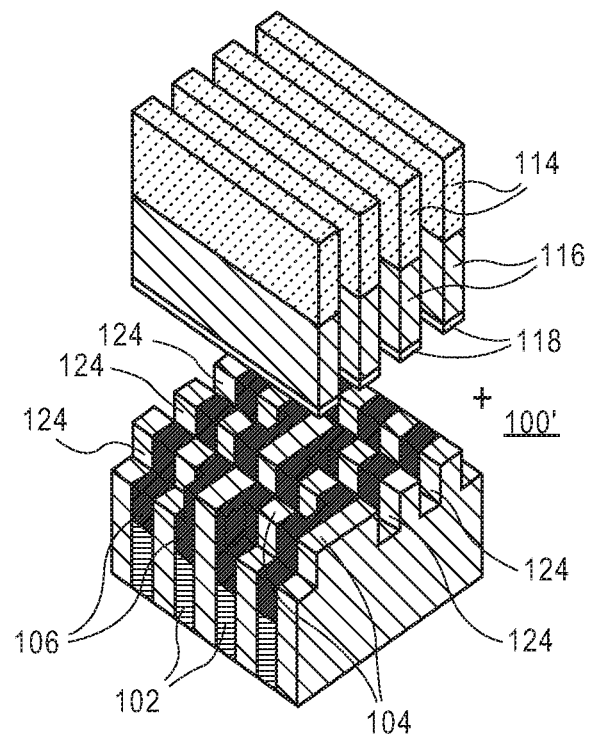
FIG. 1E  FIG. 1F

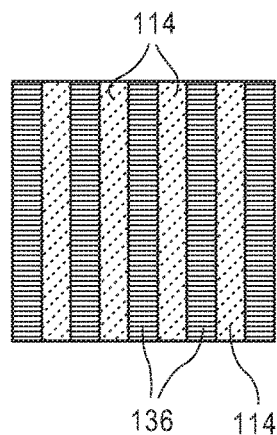
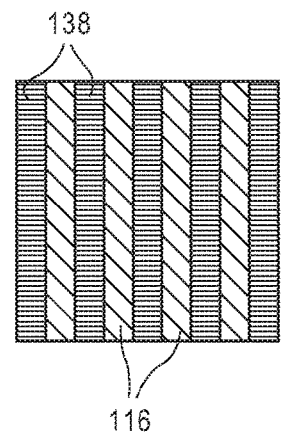
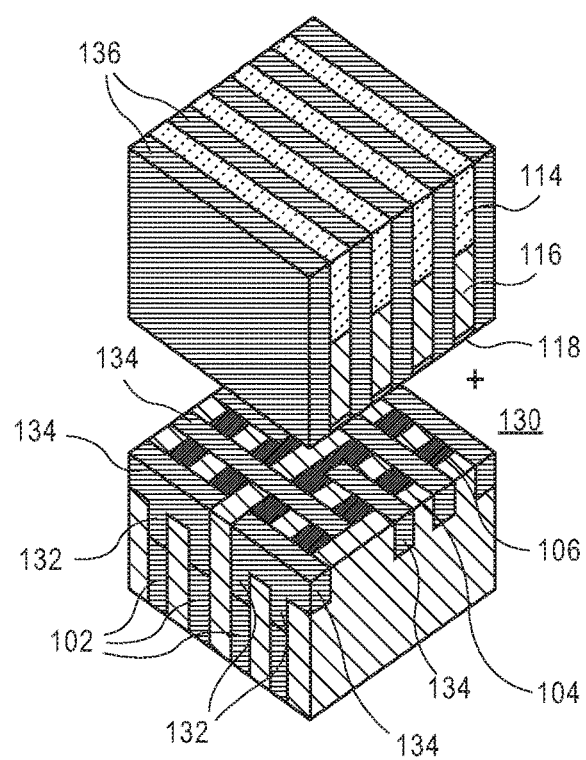
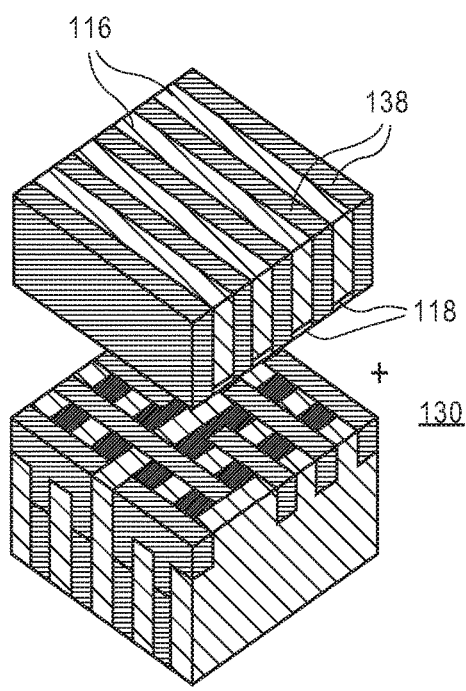
FIG. 1I   FIG. 1J

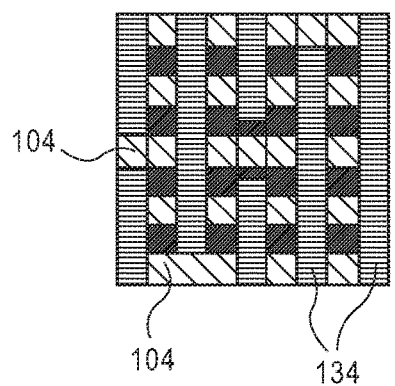
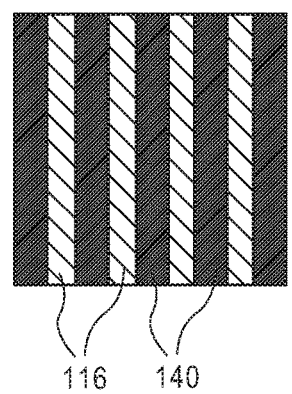
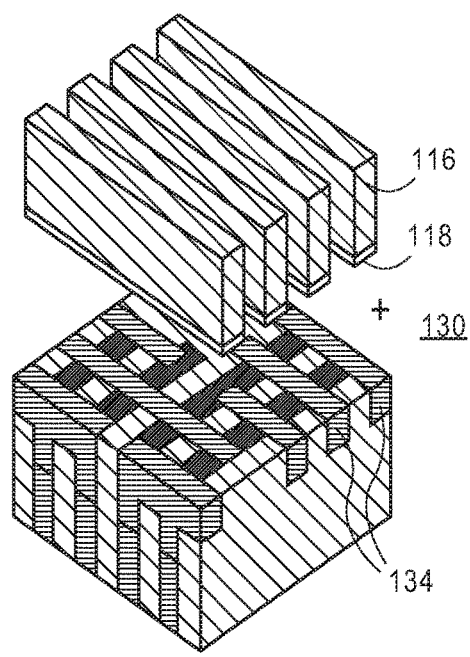
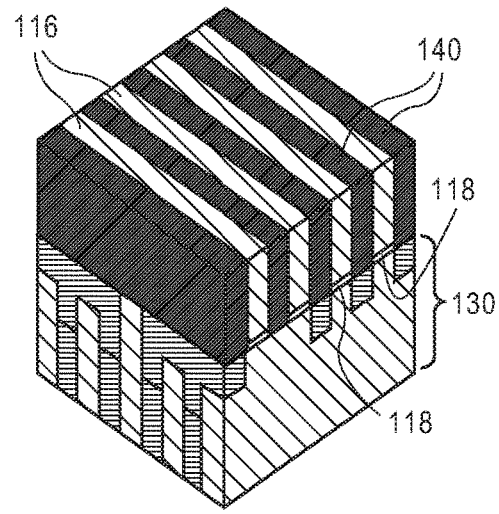
FIG. 1K        FIG. 1L

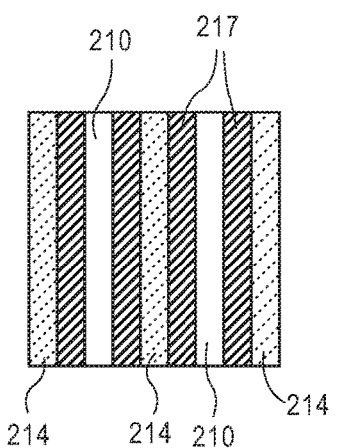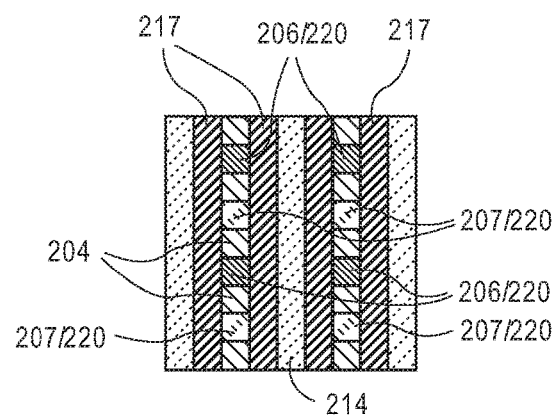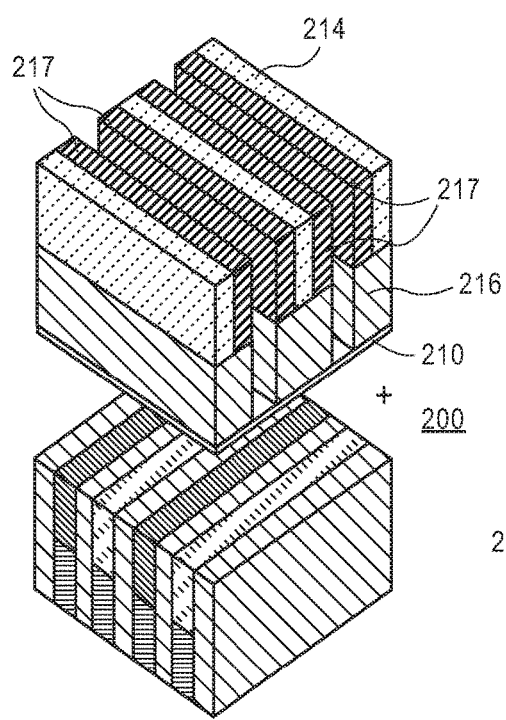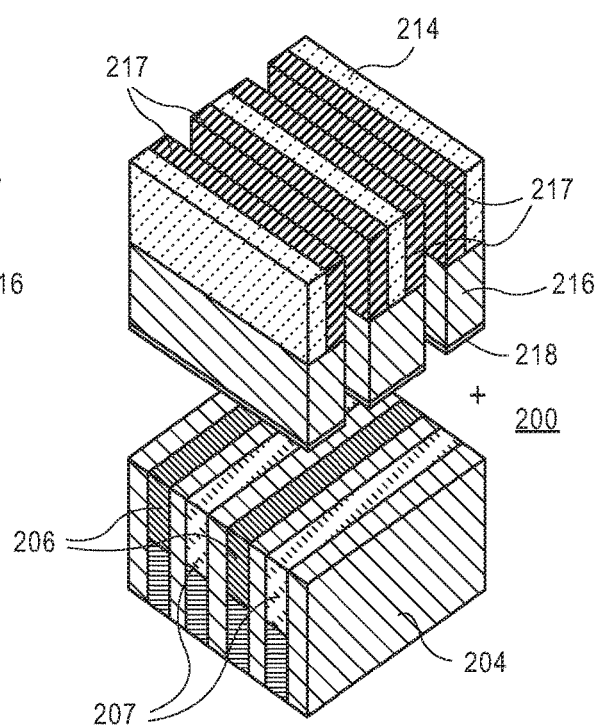
FIG. 2C  FIG. 2D

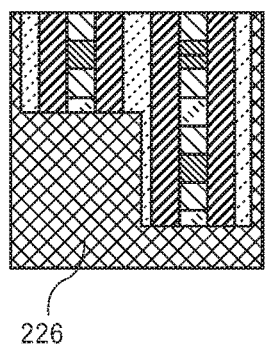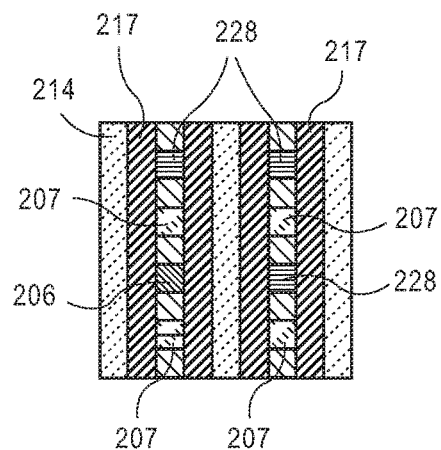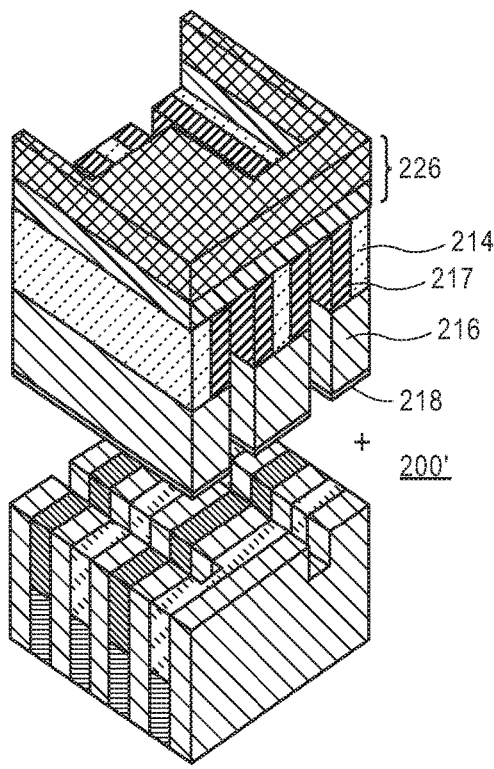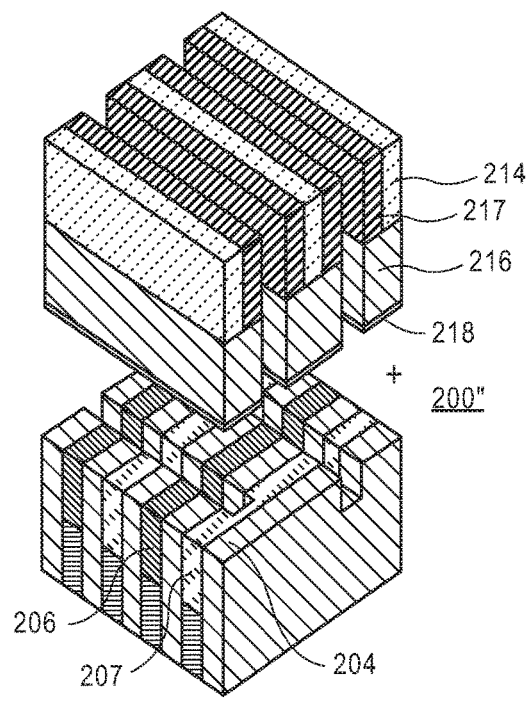
FIG. 2G          FIG. 2H

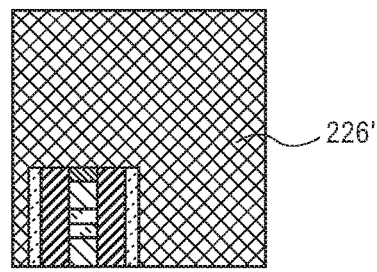
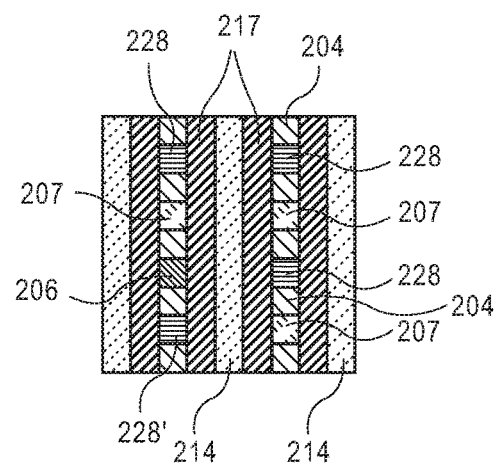
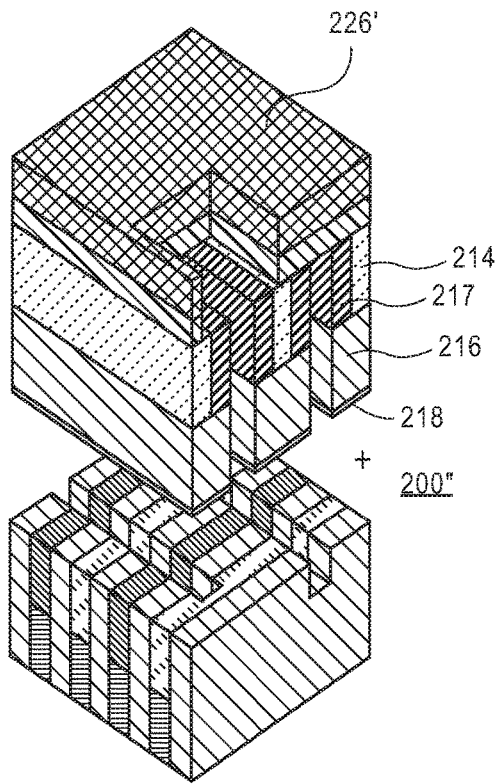
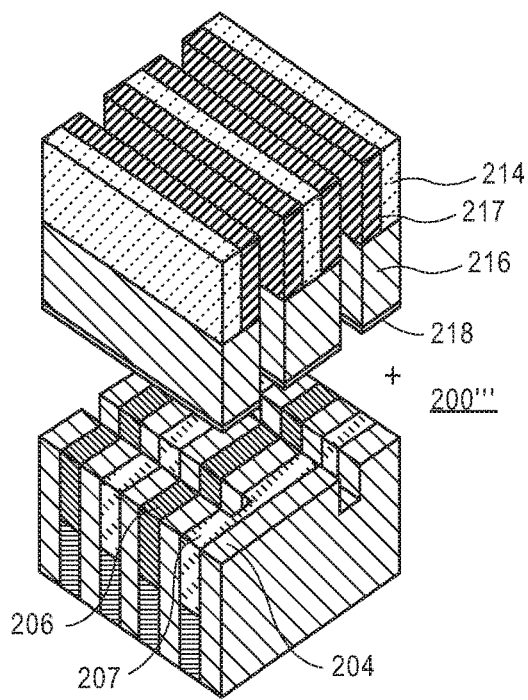
FIG. 2I　　　　　FIG. 2J

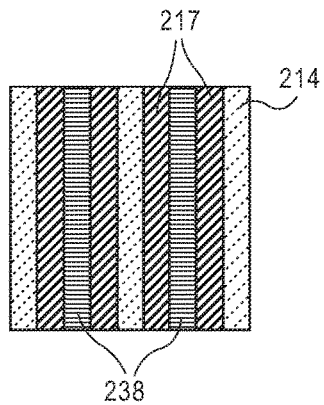 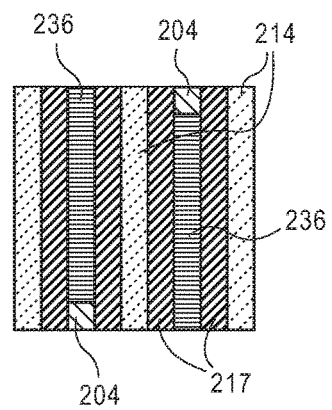
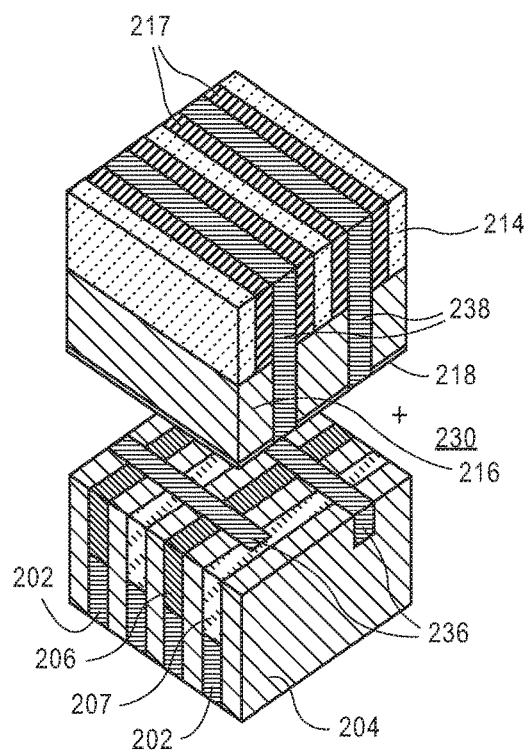 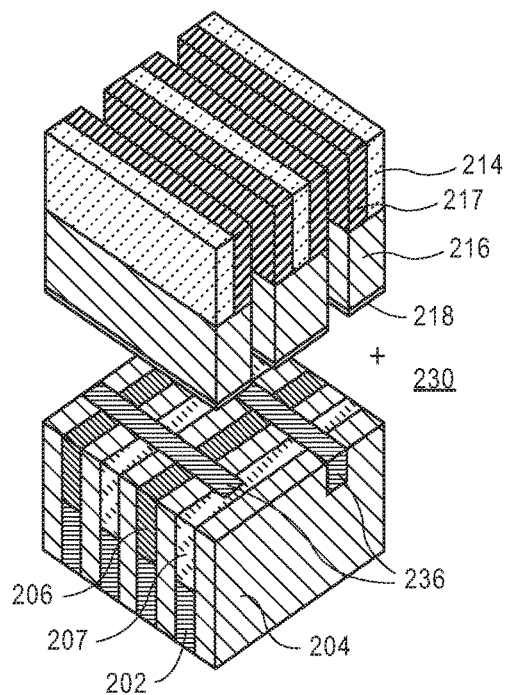
FIG. 2K                FIG. 2L

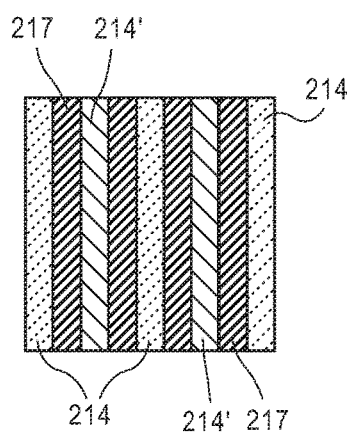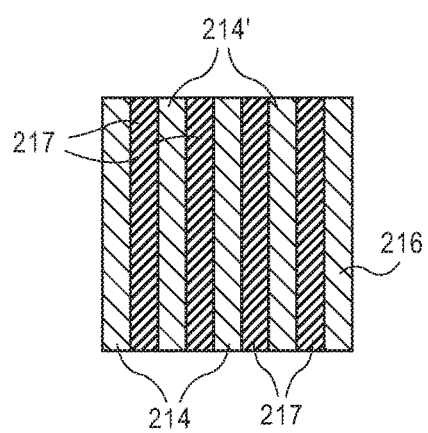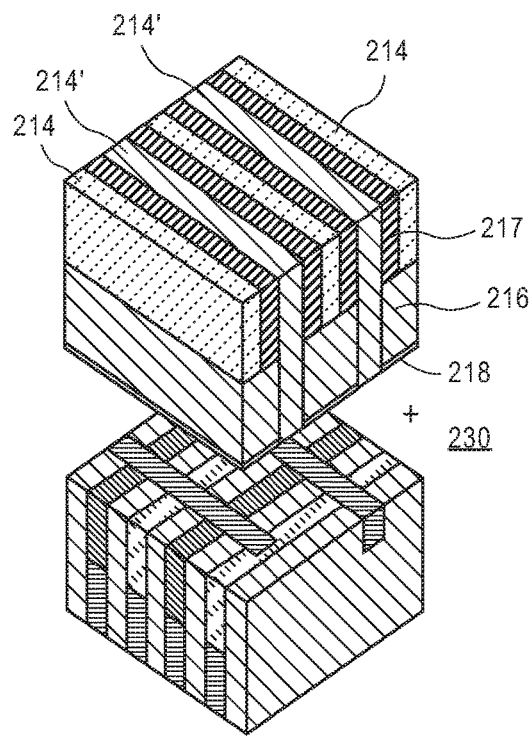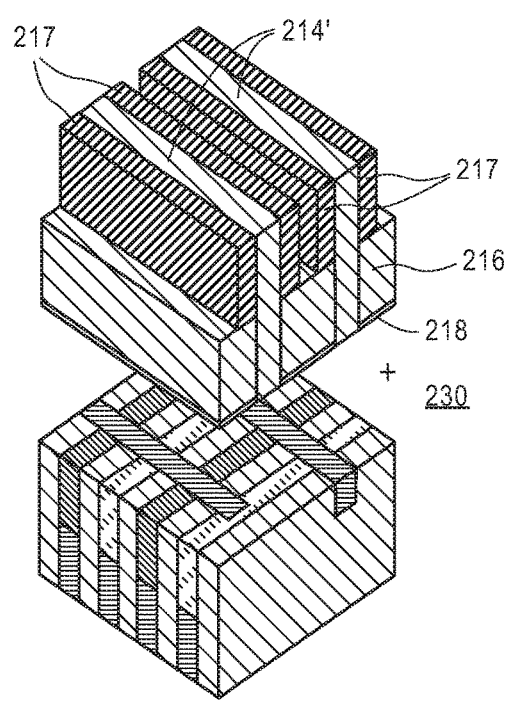
FIG. 2M     FIG. 2N

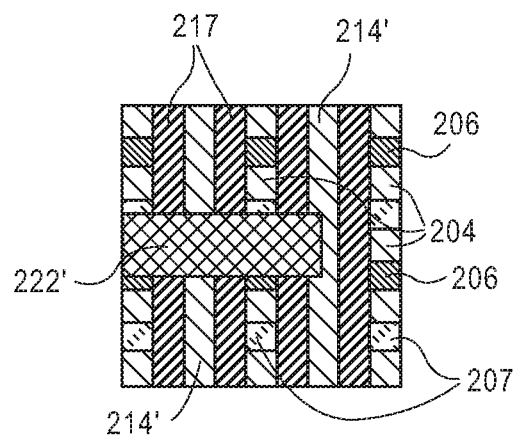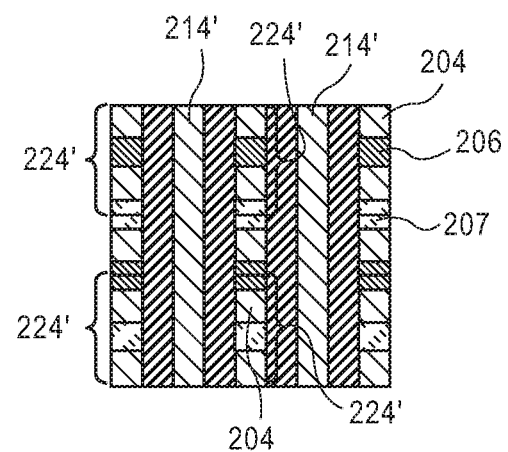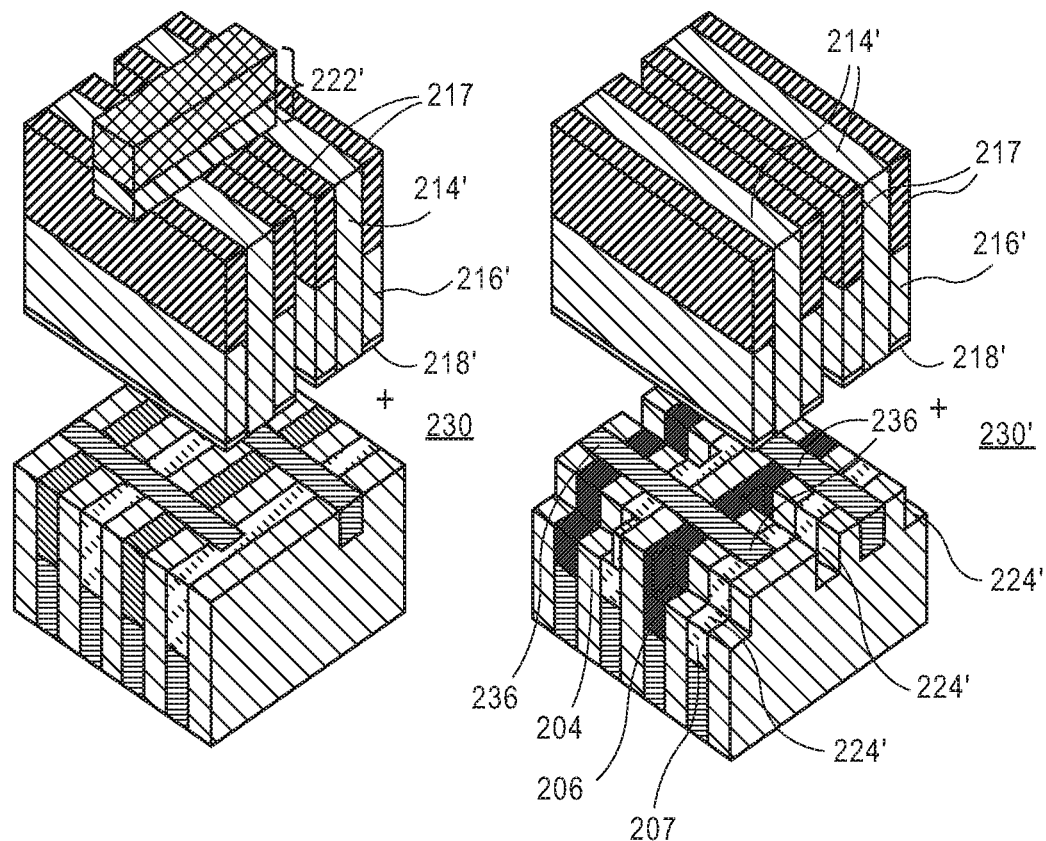
FIG. 2O    FIG. 2P

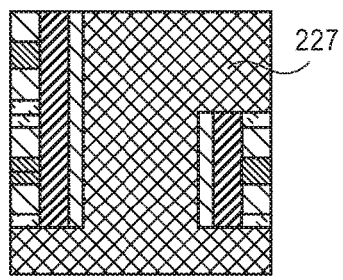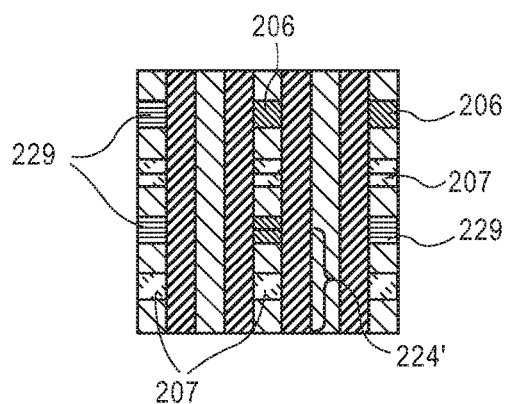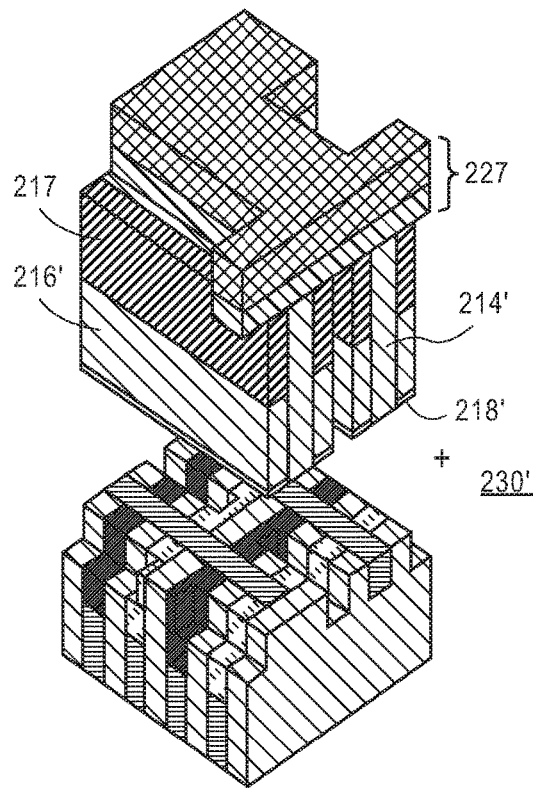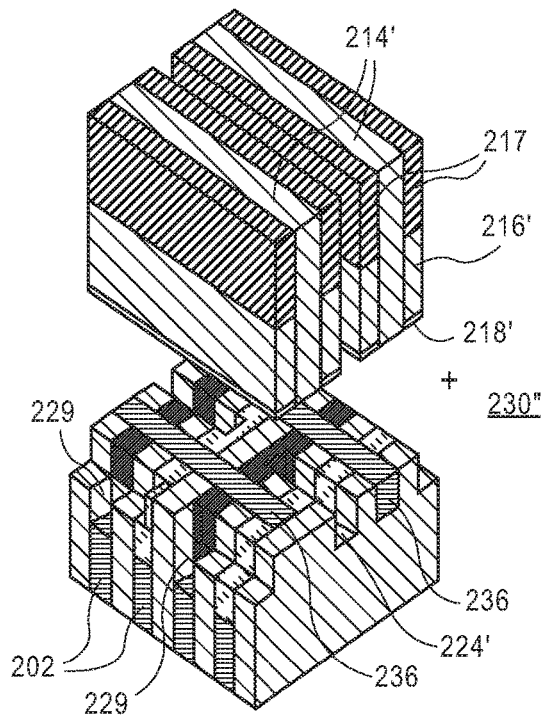
FIG. 2Q              FIG. 2R

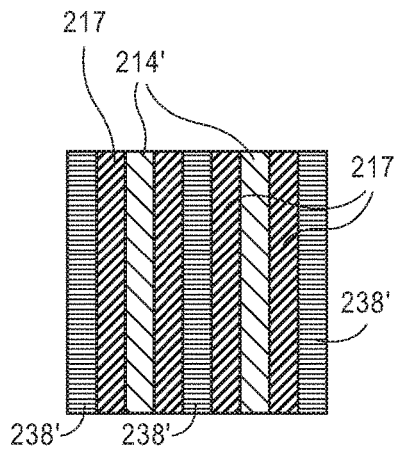
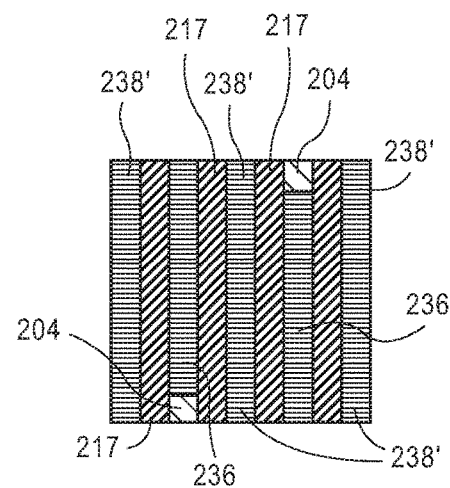
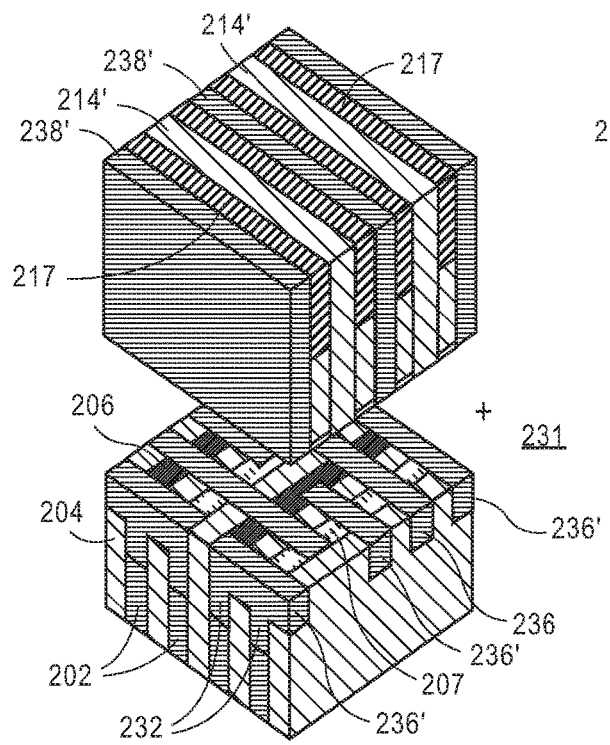
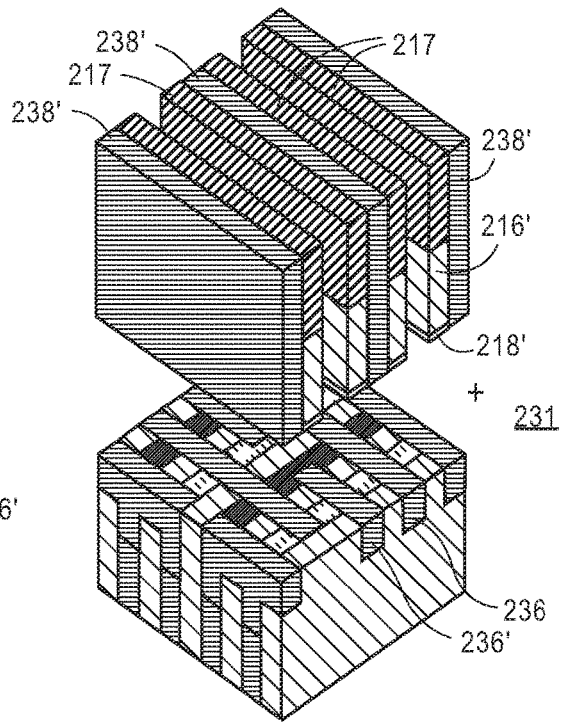
FIG. 2U  FIG. 2V

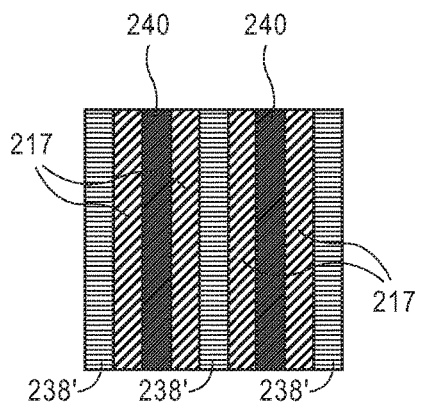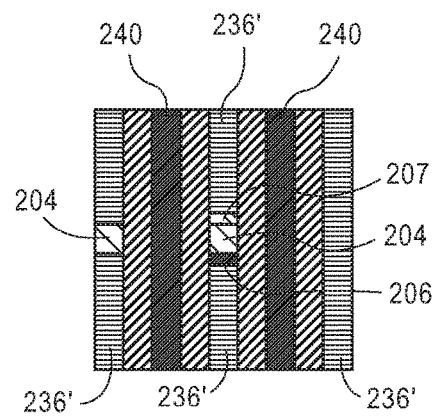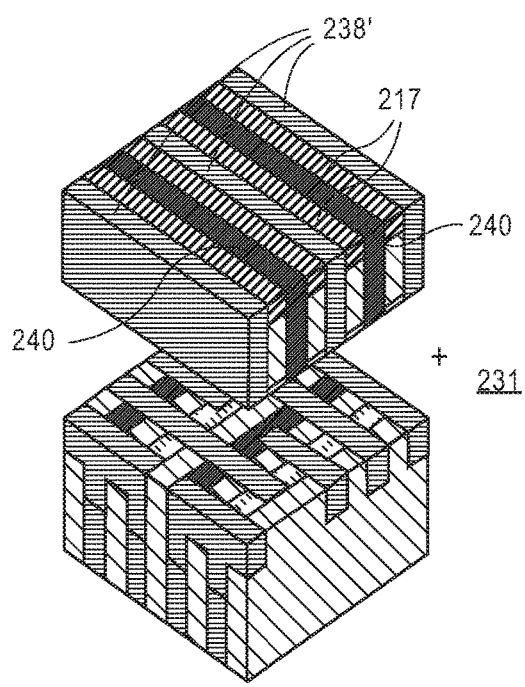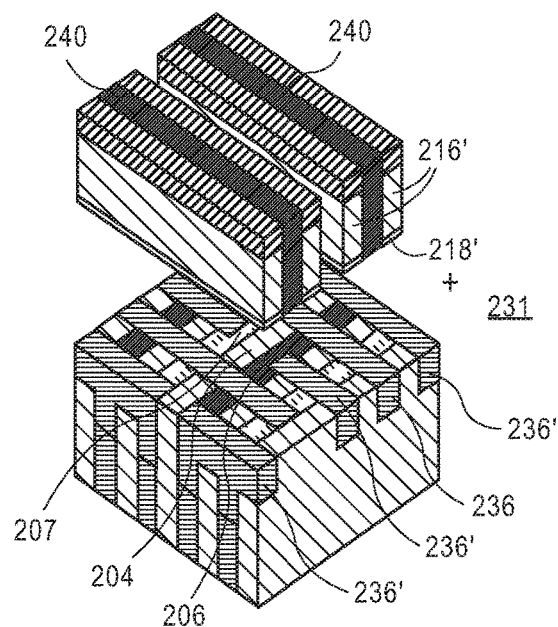
FIG. 2W                    FIG. 2X

GRID SELF-ALIGNED METAL VIA PROCESSING SCHEMES FOR BACK END OF LINE (BEOL) INTERCONNECTS AND STRUCTURES RESULTING THEREFROM

CROSS-REFERENCE TO RELATED APPLICATION

This patent application is a U.S. National Phase Application under 35 U.S.C. § 371 of International Application No. PCT/US2015/066172, filed Dec. 16, 2015, entitled "GRID SELF-ALIGNED METAL VIA PROCESSING SCHEMES FOR BACK END OF LINE (BEOL) INTERCONNECTS AND STRUCTURES RESULTING THEREFROM," which designates the United States of America, the entire disclosure of which is hereby incorporated by reference in its entirety and for all purposes.

TECHNICAL FIELD

Embodiments of the invention are in the field of semiconductor structures and processing and, in particular, grid self-aligned metal via processing schemes for back end of line (BEOL) interconnects and structures resulting therefrom.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

However, improvements are needed in the area of via manufacturing technologies.

BRIEF DESCRIPTION OF THE DRAWINGS

FIGS. 1A-1L illustrate plan views and corresponding angled cross-sectional views representing various operations in a grid self-aligned metal via processing schemes for back end of line (BEOL) interconnects, in accordance with an embodiment of the present invention.

DESCRIPTION OF THE EMBODIMENTS

Figures 1G, 1H:
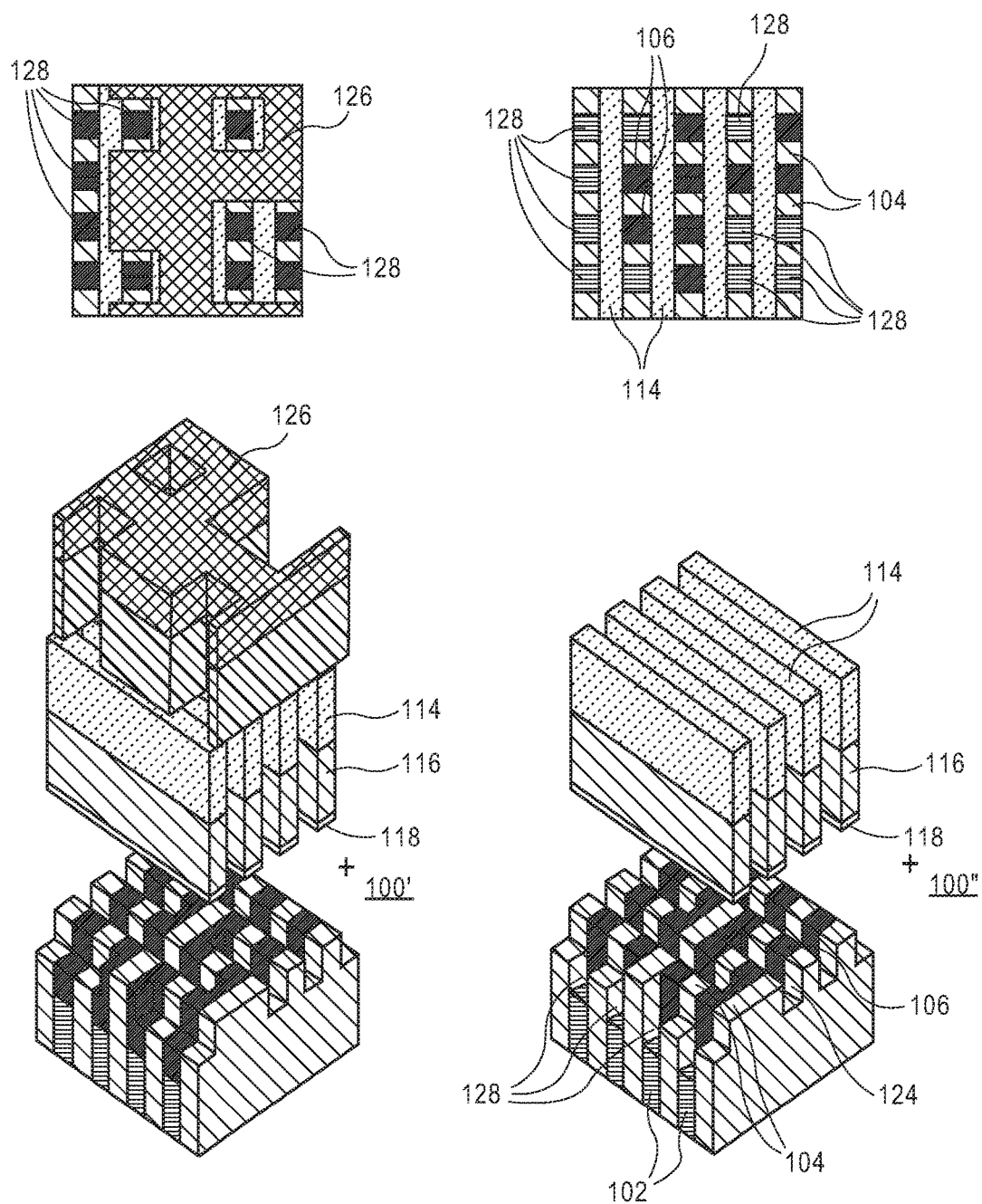

Grid self-aligned metal via processing schemes for back end of line (BEOL) interconnects, and structures resulting therefrom, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

One or more embodiments described herein are directed to grid self-aligned and super self-aligned metal via processing schemes. Embodiments described herein may be implemented to provide self-alignment methodology for metal/via layers. Almost all plug and via geometries are made possible by implementing approaches described herein. Additionally, the final via critical dimension (CD) may be independent from the lithography implemented for patterning. Furthermore, approaches described herein may provide a "circular flow" in that the end of the process flow has an identical or substantially identical layer stack and layout as the beginning of the process flow. Thus, once every operation in the process flow is developed, the process flow can be repeated as many times as needed to add as many metal/via layers as required. In one or more embodiments, overlap between perpendicular grids is used to define placement of vias and metal lines. The size of the via may be determined by the overlapped areas between two grids.

To provide context for embodiments described below, as compared with state-of-the-art approaches for via self-alignment, approaches described herein may provide for almost any plug and via placement available. Approaches described herein may require fewer selective etches. Approaches described herein may provide for final plug and via CDs that are independent of the lithography utilized.

In an aspect, then, one or more embodiments described herein are directed to an approach that employs an underlying metal grating structure as a template to build overlying conductive vias. It is to be appreciated that similar approaches may be implemented to fabricate non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment is relied on to a lesser extent. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

It is to be appreciated that a pattern needed to select a pre-formed via location can be made to be relatively small, enabling an increase in the overlay margin of a lithographic process. The pattern features can be made of uniform size, which can reduce scan time on direct write ebeam and/or optical proximity correction (OPC) complexity with optical lithography. A subsequently performed etch process may be an isotropic chemically selective etch. Such an etch process mitigates otherwise associated with profile and critical dimension and mitigates anisotropic issues typically associated with dry etch approaches. Such an etch process is also relatively much less expensive from an equipment and throughput perspective as compared to other selective removal approaches.

In a first exemplary processing scheme, FIGS. 1A-1L illustrate plan views (upper portions of Figures) and corresponding angled cross-sectional views (lower portions of Figures) representing various operations in a grid self-aligned metal via processing schemes for back end of line (BEOL) interconnects, in accordance with an embodiment of the present invention. It is to be appreciated that, although in reality they are not, different metallization layers are shown as separated (upper and lower) in the angled cross-sectional views for clarity.

Referring to FIG. 1A, a starting point structure 100 is provided as a beginning point for fabricating a new metallization layer. The starting point structure 100 includes an array of alternating metal lines 102 and dielectric lines 104. The metal lines 102 are recessed below the dielectric lines 104. A hardmask layer 106 is disposed above the metal lines 102, and alternating with the dielectric lines 104. In an embodiment, the dielectric lines 104 are composed of silicon nitride (SiN), and the hardmask layer 106 is composed of silicon carbide (SiC) or silicon oxide ($SiO_2$). A next patterning layer 108 is then fabricated above the starting point structure 100, as is depicted in FIG. 1B. In an embodiment, the next patterning layer 108 includes an etch stop layer 110, a dielectric layer 112 and a grating structure 114. In an embodiment, the etch stop layer 110 is composed of silicon oxide (SiO), the dielectric layer 112 is composed of silicon nitride (SiN), and the grating structure 114 is composed of silicon oxide (SiO). In an embodiment, the grating structure 114 is formed using a pitch halving or pitch quartering scheme, e.g., by spacer patterning.

Referring to FIG. 1C, the pattern of the grating structure 114 is transferred to the dielectric layer 112 to form patterned dielectric layer 116. In an embodiment, the pattern of the grating structure 114 is transferred to the dielectric layer 112 using an etch process that utilizes etch stop layer 110 as an end-point for the etch process. A breakthrough etch is then performed to remove exposed portions of the etch stop layer 110 to form patterned etch stop layer 118, as is depicted in FIG. 1D. In an embodiment, the breakthrough etch reveals all possible via locations 120 that could potentially be formed into structure 100.

Referring to FIG. 1E, plug patterning is then performed by forming a patterned lithographic mask 122 on the structure of FIG. 1D in locations where plugs are to be preserved. A unified pattern of the patterned lithographic mask 122 and the grating structure 114 is then transferred into structure 100 to form structure 100' having regions 124 for metal line formation within structure 100, as is depicted in FIG. 1F. In an embodiment, the unified pattern of the patterned lithographic mask 122 and the grating structure 114 is transferred into structure 100 using an etch process. Such an etch process may etch both the layers 104 and 106 at substantially the same rate (or may be performed as several etch operations) and may be followed by a cleans process to remove the patterned lithographic mask 122, as is also depicted in FIG. 1F.

Referring to FIG. 1G, via patterning is then performed by forming a patterned lithographic mask 126 on the structure of FIG. 1F, the patterned lithographic mask 126 exposing locations where vias are to be formed (e.g., a via selection process). A unified pattern of the patterned lithographic mask 126 and the grating structure 114 is then transferred into structure 100' to form structure 100" having regions 128 for metal via formation within structure 100', as is depicted in FIG. 1H. In an embodiment, the unified pattern of the patterned lithographic mask 126 and the grating structure 114 is transferred into structure 100' using an etch process. Such an etch process may etch the layer 106 selective to the layer 104, and may be followed by a cleans process to remove the patterned lithographic mask 126, as is also depicted in FIG. 1H.

Referring to FIG. 1I, a metal fill process is performed on the structure of FIG. 1I to provide underlying structure 130.

The metal fill process forms metal vias 132 and metal lines 134 in structure 130. The metal fill process may also fill the regions between the grating structure 114 with metal lines 136, as is depicted in FIG. 1I. In an embodiment, the metal fill process is performed using a metal deposition and subsequent planarization processing scheme. The structure of FIG. 1I may then be reduced in thickness to remove the grating structure 114, to expose the patterned dielectric 116 and top provide metal lines 138, which are reduced in thickness from metal lines 136, as is depicted in FIG. 1J. In an embodiment, structure of FIG. 1I may then be reduced in thickness using a planarization process such as a chemical mechanical planarization (CMP) process.

Referring to FIG. 1K, metal lines 138 are removed from the structure of FIG. 1J to leave patterned dielectric layer 116 and patterned etch stop layer 118. The metal lines 138 may be removed by a selective etch process that removes the metal lines 138 and also ensures that no metal is left to remain at a height above the material layer 104 and 106 (i.e., such that no metal remains above the plug regions of structure 130). A hardmask layer 140 is then formed on the structure of FIG. 1K, between the lines of patterned dielectric layer 116, as is depicted in FIG. 1L. In an embodiment, the hardmask layer 140 is composed of silicon carbide (SiC) or silicon oxide ($SiO_2$) and is formed using a deposition and planarization processing scheme. In one embodiment, the hardmask layer 140 is composed of the same material as the hardmask layer 106. In an embodiment, the surface of the structure formed from patterned dielectric layer 116 and the hardmask layer 140 is substantially the same as the surface of, although orthogonal to, the starting structure 100 of FIG. 1A. Thus, in an embodiment, the process described in association with FIGS. 1B-1L may be repeated on the structure of FIG. 1L to form a next metallization layer, and so on.

It is to be appreciated that the process described in association with FIGS. 1B-1L as repeated on the structure of FIG. 1L to form a next metallization layer may be referred to as a circular flow in that the end of the process flow has an identical or substantially identical layer stack and layout as the beginning of the process flow. In one embodiment, forming an additional metallization layer includes using such a circular flow. However, it is also to be appreciated that a circular or repetitive flow may only be implemented for select metallization layers. Other metallization layers in a resulting stack (e.g., layers above or below or in between layers fabricated using the processing scheme of FIGS. 1B-1L) may be fabricated using convention dual damascene or other approaches.

A resulting structure such as 131 described in association with FIG. 1L may subsequently be used as a foundation for forming subsequent metal line/via and ILD layers. Alternatively, the structure 131 of FIG. 1L may represent the final metal interconnect layer in an integrated circuit. It is to be appreciated that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. As such, in an embodiment, offset due to conventional lithograph/dual damascene patterning that must otherwise be tolerated, is not a factor for the resulting structures described herein. It is to be appreciated that the above examples have focused on via/contact formation. However, in other embodiments, similar approaches may be used to preserve or form regions for line end termination (plugs) within a metal line layer. It is also to be appreciated that, in subsequent fabrication operations, the dielectric lines may be removed to provide air gaps between the resulting metal lines.

Figures 2A, 2B:
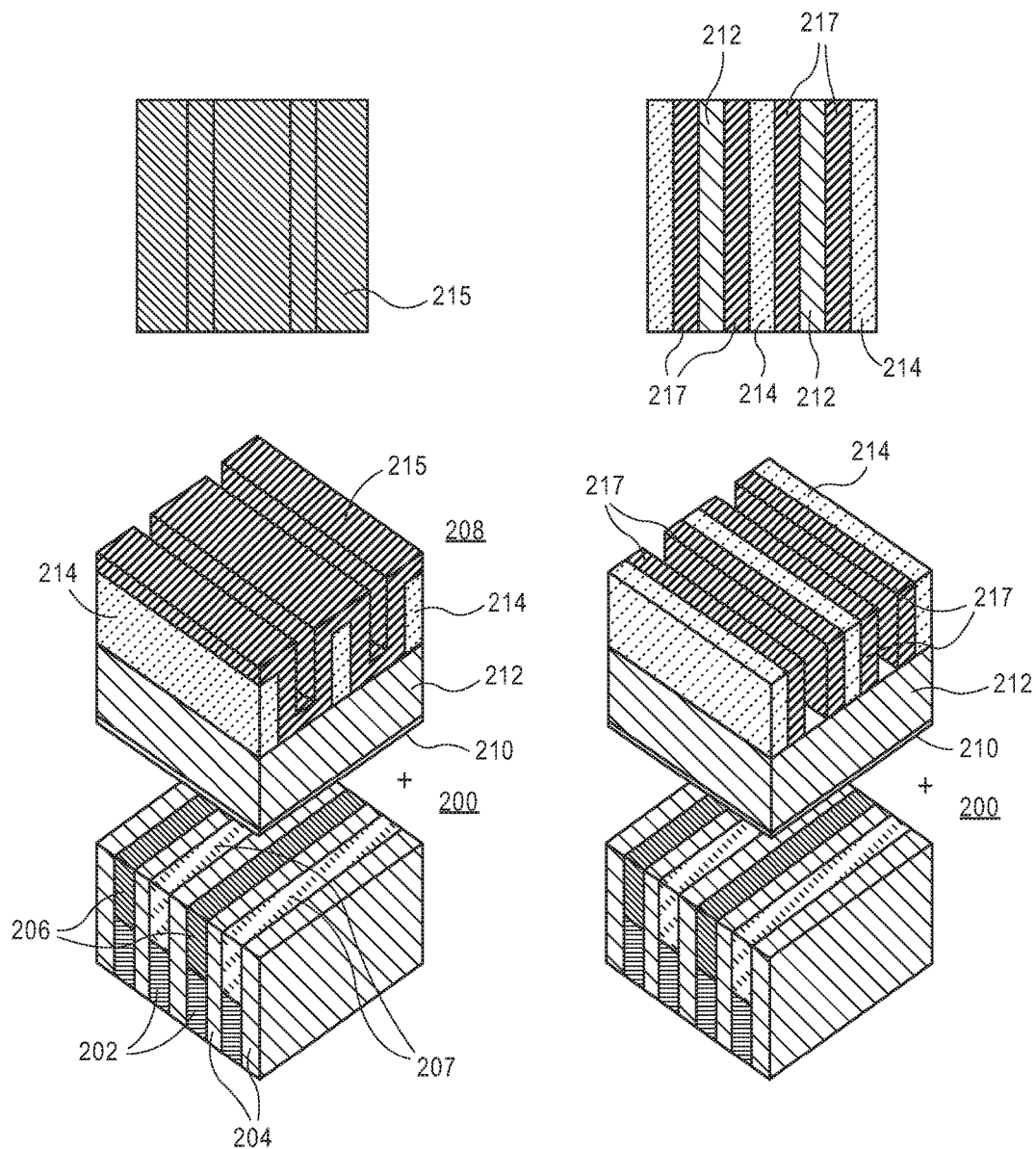
FIGS. 2A-2Y illustrate plan views and corresponding angled cross-sectional views representing various operations in a grid super self-aligned metal via processing schemes for back end of line (BEOL) interconnects, in accordance with another embodiment of the present invention.
Figure 2E:
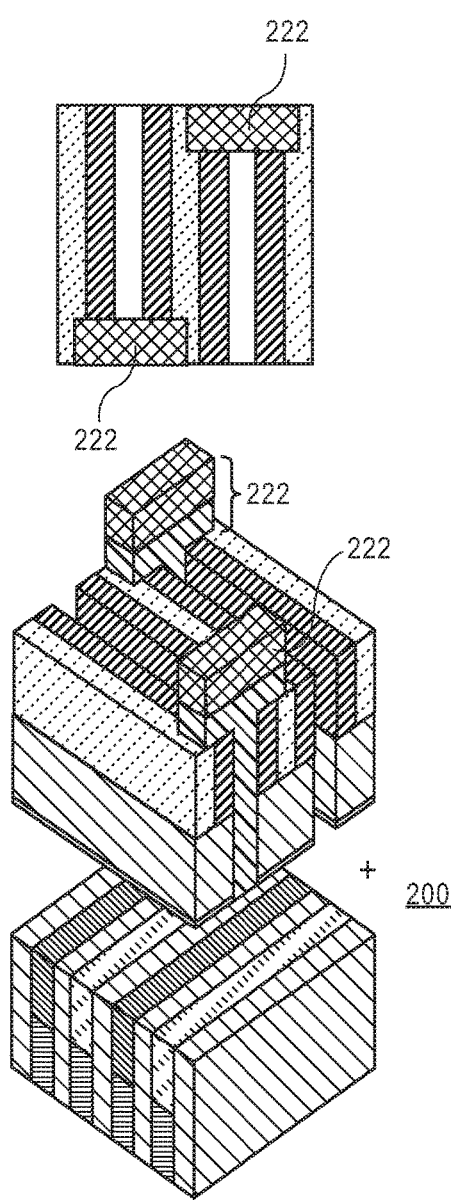
Figure 2F:
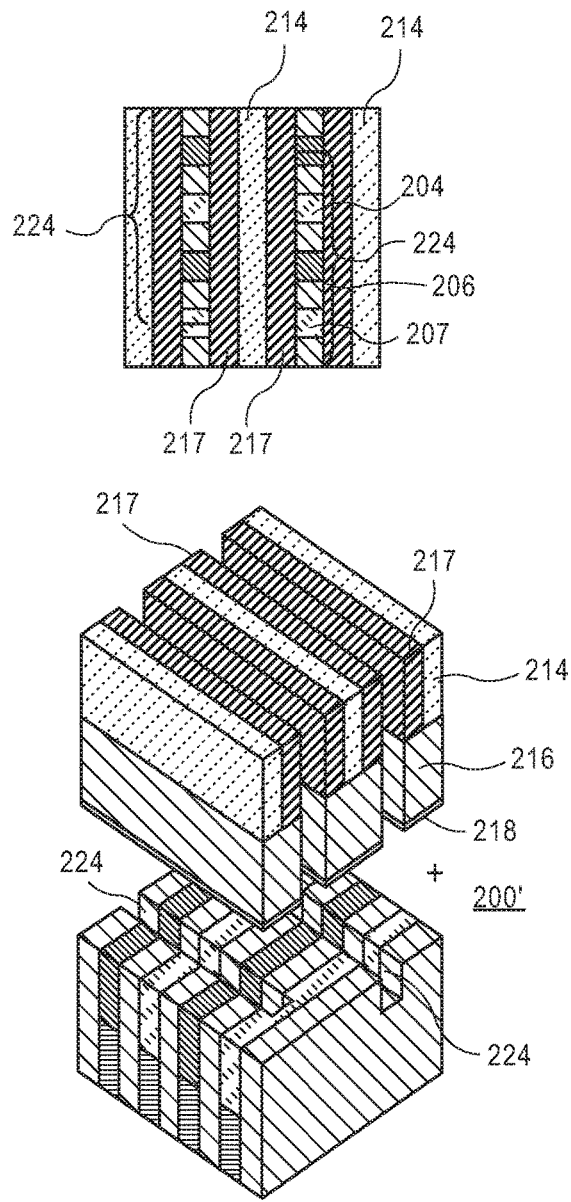
Figures 2S, 2T:
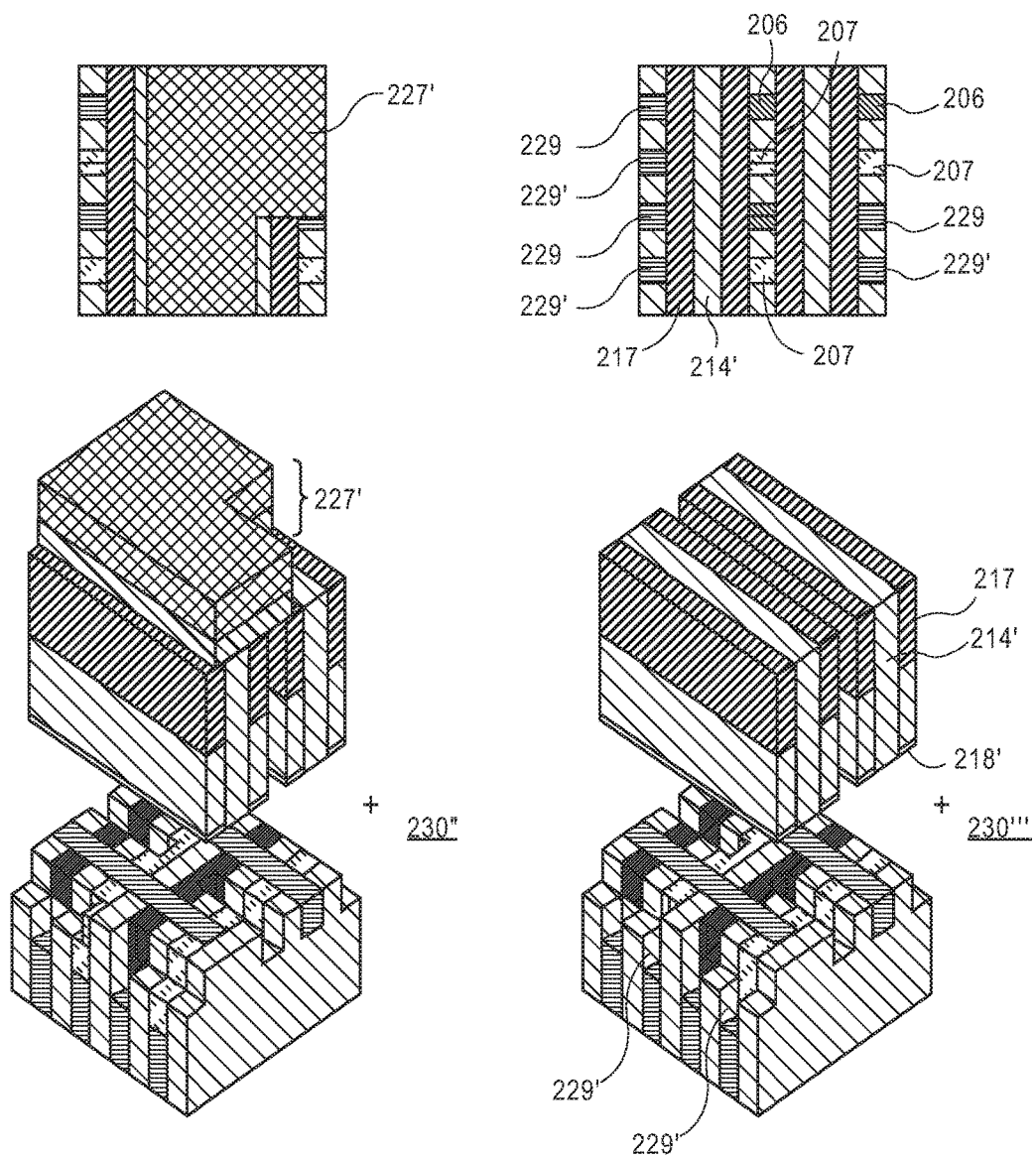
Figure 2Y:
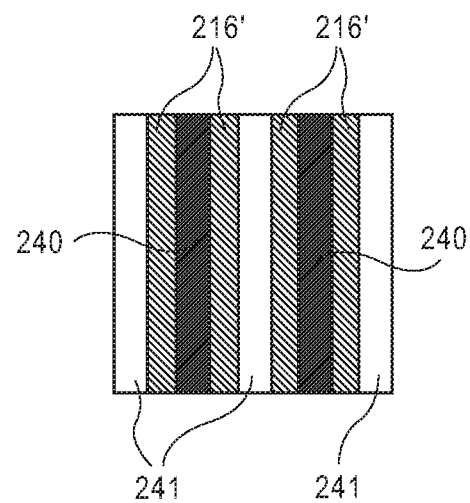
Figure 2Y:
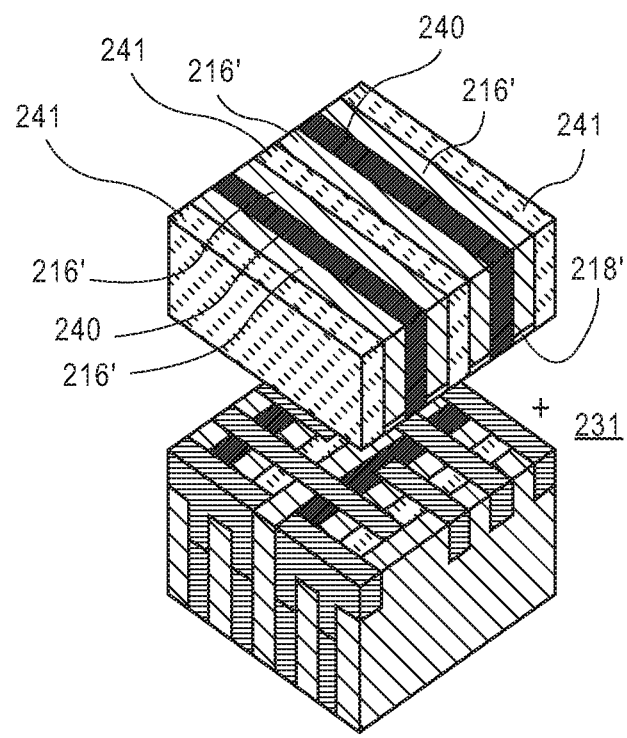

In a second exemplary processing scheme, FIGS. 2A-2Y illustrate plan views (upper portions of Figures) and corresponding angled cross-sectional views (lower portions of Figures) representing various operations in a grid super self-aligned metal via processing schemes for back end of line (BEOL) interconnects, in accordance with another embodiment of the present invention. It is to be appreciated that, although in reality they are not, different metallization layers are shown as separated (upper and lower) in the angled cross-sectional views for clarity.

Referring to FIG. 2A, a starting point structure 200 is provided as a beginning point for fabricating a new metallization layer. The starting point structure 200 includes an array of alternating metal lines 202 and dielectric lines 204. The metal lines 202 are recessed below the dielectric lines 204. A first hardmask layer 206 and a second hardmask layer 207 are alternatingly disposed above the metal lines 202, and between the dielectric lines 204. In an embodiment, the dielectric lines 204 are composed of silicon nitride (SiN), the first hardmask layer 206 is composed of silicon carbide (SiC), and the second hardmask layer 207 is composed of silicon oxide ($SiO_2$). A next patterning layer 208 is then fabricated above the starting point structure 200, as is also depicted in FIG. 2A. In an embodiment, the next patterning layer 208 includes an etch stop layer 210, a dielectric layer 212, a grating structure 214, and a conformal layer 215. In an embodiment, the etch stop layer 210 is composed of silicon oxide ($SiO_2$), the dielectric layer 212 is composed of silicon nitride (SiN), the grating structure 214 is composed of silicon, and the conformal layer 215 is composed of titanium oxide (TiO). In an embodiment, the grating structure 214 is formed using a pitch halving or pitch quartering scheme, e.g., by spacer patterning. The next patterning layer 208 is then subjected to an anisotropic etch process to provide spacers 217 among the lines of the grating structure 214, as is depicted in FIG. 2B.

Referring to FIG. 2C, the pattern of the upper structure of FIG. 2B is transferred to the dielectric layer 212 to form patterned dielectric layer 216. In an embodiment, the pattern of the upper structure of FIG. 2B is transferred to the dielectric layer 212 using an etch process that utilizes etch stop layer 210 as an end-point for the etch process. A breakthrough etch is then performed to remove exposed portions of the etch stop layer 210 to form patterned etch stop layer 218, as is depicted in FIG. 2D. In an embodiment, the breakthrough etch reveals half of all possible via locations 220 that could potentially be formed into structure 200.

Referring to FIG. 2E, first plug patterning is then performed by forming a patterned lithographic mask 222 on the structure of FIG. 2D in locations where plugs are to be preserved. A unified pattern of the patterned lithographic mask 222 and the pattern of the upper structure of FIG. 2D is then transferred into structure 200 to form structure 200' having regions 224 for metal line formation within structure 200, as is depicted in FIG. 2F. In an embodiment, the unified pattern of the patterned lithographic mask 222 and the pattern of the upper structure of FIG. 2D is transferred into structure 200 using an etch process. Such an etch process may etch all of the layers 204, 206 and 207 at substantially the same rate (or may be performed as several etch operations) and may be followed by a cleans process to remove the patterned lithographic mask 222, as is also depicted in FIG. 2F.

Referring to FIG. 2G, first via patterning is then performed by forming a patterned lithographic mask 226 on the structure of FIG. 2F, the patterned lithographic mask 226 exposing locations where vias are to be formed (e.g., a via selection process). A unified pattern of the patterned lithographic mask 226 and the pattern of the upper structure of FIG. 2F is then transferred into structure 200' to form structure 200" having regions 228 for metal via formation within structure 200', as is depicted in FIG. 2H. In an embodiment, the unified pattern of the patterned lithographic mask 226 and the pattern of the upper structure of FIG. 2F is transferred into structure 200' using an etch process. Such an etch process may etch the layer 206 selective to the layer 204 and to the layer 207, and may be followed by a cleans process to remove the patterned lithographic mask 226, as is also depicted in FIG. 2H.

Referring to FIG. 2I, second via patterning is then performed by forming a patterned lithographic mask 226' on the structure of FIG. 2H, the patterned lithographic mask 226' exposing locations where vias are to be formed (e.g., a via selection process). A unified pattern of the patterned lithographic mask 226' and the pattern of the upper structure of FIG. 2H is then transferred into structure 200" to form structure 200''' having regions 228' for metal via formation within structure 200", as is depicted in FIG. 2J. In an embodiment, the unified pattern of the patterned lithographic mask 226' and the pattern of the upper structure of FIG. 2H is transferred into structure 200" using an etch process. Such an etch process may etch the layer 207 selective to the layer 204 and to the layer 206, and may be followed by a cleans process to remove the patterned lithographic mask 226', as is also depicted in FIG. 2J.

Referring to FIG. 2K, a metal fill process is performed on the structure of FIG. 2J to provide underlying structure 230. The metal fill process forms metal vias (not seen here) and metal lines 236 in structure 230. The metal fill process may also fill the regions between the lines 214 and 217 with metal lines 238, as is depicted in FIG. 2K. In an embodiment, the metal fill process is performed using a metal deposition and subsequent planarization processing scheme. Metal lines 238 are then removed from the structure of FIG. 2K to leave lines 214 and 217, patterned dielectric layer 216 and patterned etch stop layer 218, as is depicted in FIG. 2L. The metal lines 238 may be removed by a selective etch process that removes the metal lines 238 and also ensures that no metal is left to remain at a height above the material layers 204, 206 and 207 (i.e., such that no metal remains above the plug regions of structure 230).

Referring to FIG. 2M, a grating layer 214' is then formed on the structure of FIG. 2L, between the lines 217. In an embodiment, the grating layer 214' is composed of boron doped silicon and is formed using a deposition and planarization processing scheme. The lines 214 are then removed from the structure of FIG. 2M, as is depicted in FIG. 2N. In an embodiment, lines 214 are then removed from the structure of FIG. 2M using a selective wet etch process.

Referring to FIG. 2O, the portions of the patterned dielectric layer 216 and the patterned etch stop layer 218 not protected by the grating layer 214' or the lines 217 are removed, e.g., by a selective eth process, to form twice patterned dielectric layer 216' and twice patterned etch stop layer 218'. Referring again to FIG. 2O, second plug patterning is then performed by forming a patterned lithographic mask 222' in locations where plugs are to be preserved. A unified pattern of the patterned lithographic mask 222' and the pattern of the grating layer 214' and the lines 217 is then transferred into structure 230 to form structure 230' having regions 224' for metal line formation within structure 230, as is depicted in FIG. 2P. In an embodiment, the unified pattern of the patterned lithographic mask 222' and the pattern of the grating layer 214' and the lines 217 is transferred into structure 230 using an etch process. Such an etch process may etch all of the layers 204, 206 and 207 at substantially the same rate (or may be performed as several etch operations) and may be followed by a cleans process to remove the patterned lithographic mask 222', as is also depicted in FIG. 2P.

Referring to FIG. 2Q, third via patterning is then performed by forming a patterned lithographic mask 227 on the structure of FIG. 2P, the patterned lithographic mask 227 exposing locations where vias are to be formed (e.g., a via selection process). A unified pattern of the patterned lithographic mask 227 and the pattern of the upper structure of FIG. 2P is then transferred into structure 230' to form structure 230" having regions 229 for metal via formation within structure 230', as is depicted in FIG. 2R. In an embodiment, the unified pattern of the patterned lithographic mask 227 and the pattern of the upper structure of FIG. 2P is transferred into structure 230' using an etch process. Such an etch process may etch the layer 206 selective to the layer 204 and to the layer 207, and may be followed by a cleans process to remove the patterned lithographic mask 227, as is also depicted in FIG. 2R.

Referring to FIG. 2S, fourth via patterning is then performed by forming a patterned lithographic mask 227' on the structure of FIG. 2R, the patterned lithographic mask 227' exposing locations where vias are to be formed (e.g., a via selection process). A unified pattern of the patterned lithographic mask 227' and the pattern of the upper structure of FIG. 2R is then transferred into structure 230" to form structure 230''' having regions 229' for metal via formation within structure 230", as is depicted in FIG. 2T. In an embodiment, the unified pattern of the patterned lithographic mask 227' and the pattern of the upper structure of FIG. 2R is transferred into structure 230" using an etch process. Such an etch process may etch the layer 207 selective to the layer 204 and to the layer 206, and may be followed by a cleans process to remove the patterned lithographic mask 227', as is also depicted in FIG. 2T.

Referring to FIG. 2U, a metal fill process is performed on the structure of FIG. 2T to provide underlying structure 231. The metal fill process forms metal vias 232 and metal lines 236' in structure 231. The metal fill process may also fill the regions between the lines 214' and 217 with metal lines 238', as is depicted in FIG. 2U. In an embodiment, the metal fill process is performed using a metal deposition and subsequent planarization processing scheme. Grating layer 214' is then removed to leave lines 217 and metal lines 238', as is depicted in FIG. 2V. In an embodiment, grating layer 214' is removed using a selective wet etch process.

Referring to FIG. 2W, a hardmask layer 240 is then formed on the structure of FIG. 2V, between the lines of the twice patterned dielectric layer 216'. In an embodiment, the hardmask layer 240 is composed of silicon carbide (SiC) and is formed using a deposition and planarization processing scheme. In one embodiment, the hardmask layer 240 is composed of the same material as the hardmask layer 206. Metal lines 238' are then removed from the structure of FIG. 2W, as is depicted in FIG. 2X. The metal lines 238' may be removed by a selective etch process that removes the metal lines 238' and also ensures that no metal is left to remain at a height above the material layers 204, 206 and 207 (i.e., such that no metal remains above the plug regions of structure 231).

Referring to FIG. 2Y, a hardmask layer 241 is then formed on the structure of FIG. 2X, between the lines of the twice patterned dielectric layer 216'. In an embodiment, the hardmask layer 241 is composed of silicon oxide ($SiO_2$) and is formed using a deposition and planarization processing scheme. In one embodiment, the hardmask layer 241 is composed of the same material as the hardmask layer 207. In an embodiment, the planarization process is performed to a level such that lines 217 are removed, exposing twice patterned dielectric layer 216'. In an embodiment, the surface of the structure formed from twice patterned dielectric layer 216', the hardmask layer 240, and the hardmask layer 241 of FIG. 2Y is substantially the same as the surface of, although orthogonal to, the starting structure 200 of FIG. 2A. Thus, in an embodiment, the process described in association with FIGS. 2A-2Y may be repeated on the structure of FIG. 2Y to form a next metallization layer, and so on.

It is to be appreciated that the process described in association with FIGS. 2A-2Y as repeated on the structure of FIG. 2Y to form a next metallization layer may be referred to as a circular flow in that the end of the process flow has an identical or substantially identical layer stack and layout as the beginning of the process flow. In one embodiment, forming an additional metallization layer includes using such a circular flow. However, it is also to be appreciated that a circular or repetitive flow may only be implemented for select metallization layers. Other metallization layers in a resulting stack (e.g., layers above or below or in between layers fabricated using the processing scheme of FIGS. 2A-2Y) may be fabricated using convention dual damascene or other approaches.

A resulting structure such as 231 described in association with FIG. 2Y may subsequently be used as a foundation for forming subsequent metal line/via and ILD layers. Alternatively, the structure 231 of FIG. 2Y may represent the final metal interconnect layer in an integrated circuit. It is to be appreciated that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. As such, in an embodiment, offset due to conventional lithograph/dual damascene patterning that must otherwise be tolerated, is not a factor for the resulting structures described herein. It is to be appreciated that the above examples have focused on via/contact formation. However, in other embodiments, similar approaches may be used to preserve or form regions for line end termination (plugs) within a metal line layer. It is also to be appreciated that, in subsequent fabrication operations, the dielectric lines may be removed to provide air gaps between the resulting metal lines.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), nitrides of silicon (e.g., silicon nitride ($Si_3N_4$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect. As will be described further below, top surfaces of the lower interconnect lines may be used for self-aligned via and plug formation.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials, such as silicon carbide. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be appreciated that the layers and materials described in association with FIGS. 1A-1L and 2A-2Y are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 1L or 2Y may be fabricated on underlying lower level interconnect layers.

As described above, patterned features may be patterned in a grating-like pattern with lines, holes or trenches spaced at a constant pitch and having a constant width. The pattern, for example, may be fabricated by a pitch halving or pitch quartering approach. In an example, a blanket film (such as a polycrystalline silicon film) is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion litho (i193), EUV and/or EBDW lithography, directed self-assembly, etc.

In an embodiment, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

To provide further context for the above described embodiments, patterning and aligning of features at less than approximately 50 nanometer pitch requires many reticles and critical alignment strategies that are extremely expensive for a semiconductor manufacturing process. Generally, embodiments described herein involve the fabrication of metal and via patterns based on the positions of an underlying layer. That is, in contrast to conventional top-down patterning approaches, a metal interconnect process is effectively reversed and built from the previous layer up. This is in contrast to a conventional approach such as dual damascene metallization where an interlayer dielectric (ILD) is first deposited, with a pattern for metal and via layers subsequently patterned therein. In the conventional approach, alignment to a previous layer is performed using a lithography scanner alignment system. The ILD is then etched.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 3:
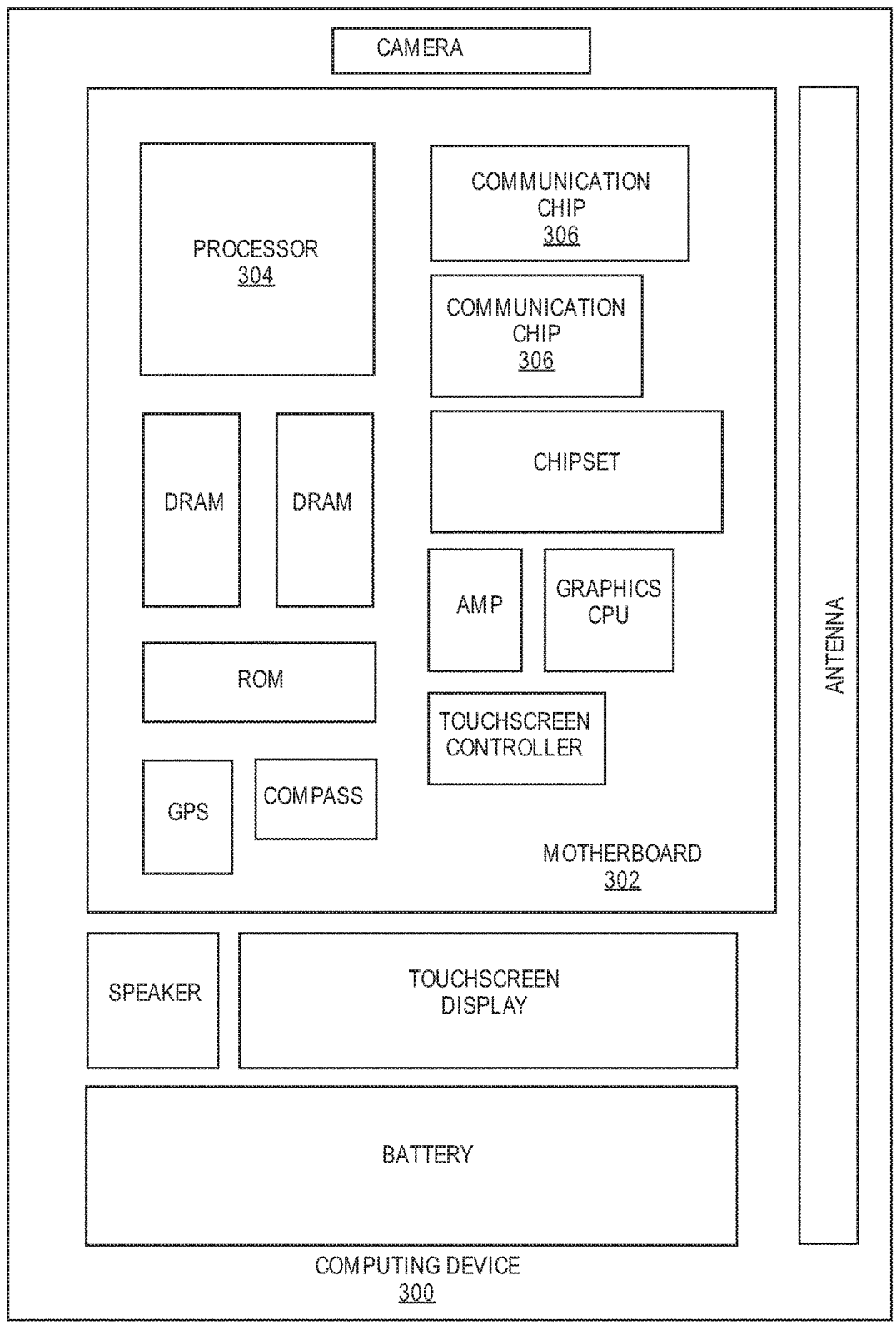
FIG. 3 illustrates a computing device in accordance with one implementation of an embodiment of the invention.

FIG. 3 illustrates a computing device 300 in accordance with one implementation of the invention. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of embodiments of the invention, the integrated circuit die of the processor includes one or more structures, such as self-aligned vias, built in accordance with implementations of embodiments of the invention. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of embodiments of the invention, the integrated circuit die of the communication chip includes one or more structures, such as self-aligned vias, built in accordance with implementations of embodiments of the invention.

In further implementations, another component housed within the computing device 300 may contain an integrated circuit die that includes one or more structures, such as self-aligned vias, built in accordance with implementations of embodiments of the invention.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Figure 4:
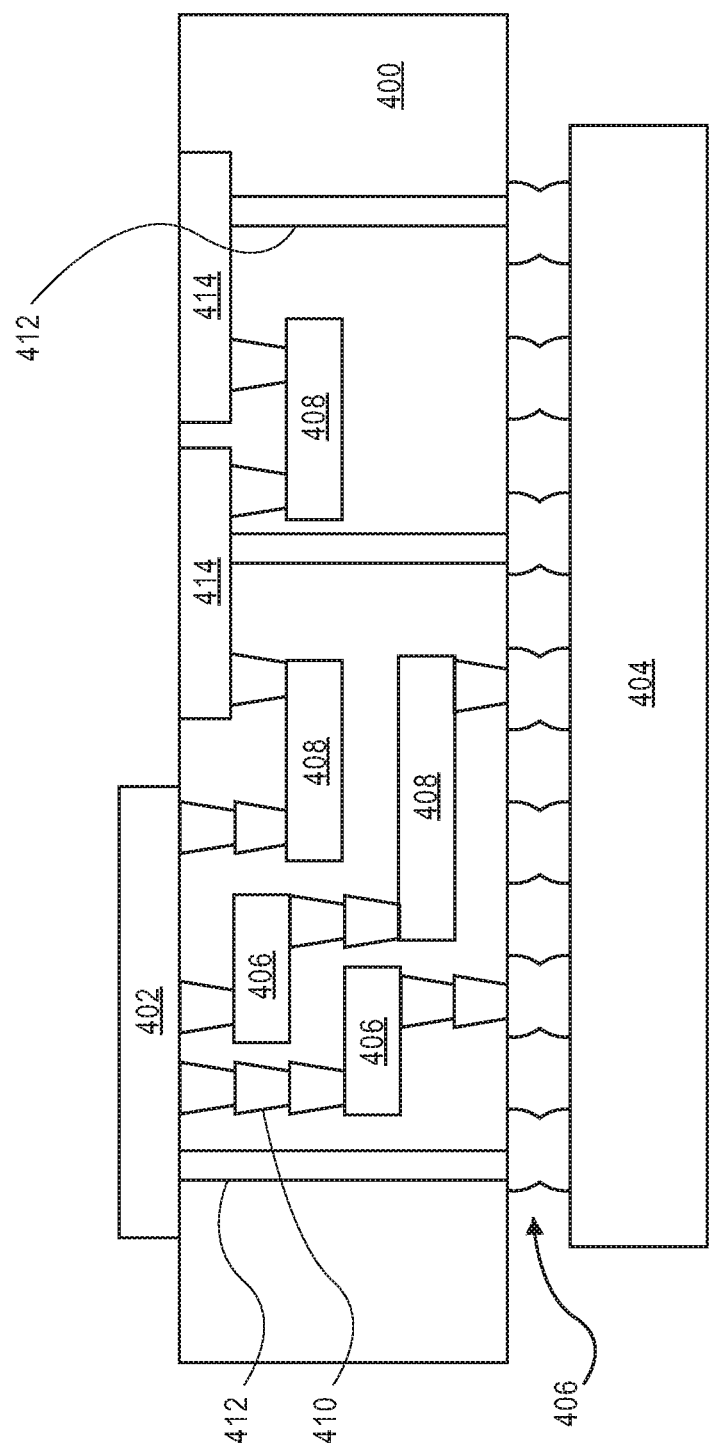
FIG. 4 is an interposer implementing one or more embodiments of the invention.

FIG. 4 illustrates an interposer 400 that includes one or more embodiments of the invention. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400. In accordance with embodiments of the invention, apparatuses or processes disclosed herein may be used in the fabrication of interposer 400.

Thus, embodiments of the present invention include grid self-aligned metal via processing schemes for back end of line (BEOL) interconnects, and structures resulting therefrom.

In an embodiment, a method of fabricating an interconnect structure for a semiconductor die includes forming a lower metallization layer including alternating metal lines and dielectric lines above a substrate, the dielectric lines raised above the metal lines. The method also includes forming a hardmask layer on the metal lines of the lower metallization layer, between and co-planar with the dielectric lines of the lower metallization layer. The method also includes forming a grating structure above and orthogonal to the alternating metal lines and dielectric lines of the lower metallization layer. The method also includes forming a mask above the grating structure, the mask exposing select regions of the hardmask layer exposed by the grating structure. The method also includes removing the select regions of the hardmask layer to expose select regions of the metal lines of the lower metallization layer. The method also includes forming metal vias on the select regions of the metal lines of the lower metallization layer.

In one embodiment, removing the select regions of the hardmask layer to expose the select regions of the metal lines of the lower metallization layer includes selecting via locations.

In one embodiment, forming the grating structure above and orthogonal to the alternating metal lines and dielectric lines of the lower metallization layer includes exposing all possible via locations above the lower metallization layer.

In one embodiment, the method further includes, prior to forming the mask above the grating structure, forming a plug mask above the grating structure, the plug mask exposing select regions of the hardmask layer and the dielectric lines exposed by the grating structure, and removing uppermost portions of the select regions of the hardmask layer and the dielectric lines exposed by the grating structure to form upper metal line locations above and orthogonal to the metal lines of the lower metallization layer.

In one embodiment, the method further includes removing the plug mask prior to forming the mask above the grating structure.

In one embodiment, the method further includes forming metal lines in the upper metal line locations at substantially the same time as forming the metal vias on the select regions of the metal lines of the lower metallization layer.

In one embodiment, the method further includes forming a structure of alternating dielectric lines and hardmask lines above the metal lines formed in the upper metal line locations, the structure of alternating dielectric lines and hardmask lines parallel with a direction of the metal lines in the upper metal line locations and orthogonal to the alternating metal lines and dielectric lines of the lower metallization layer.

In one embodiment, the method further includes forming an additional metallization layer using the structure of alternating dielectric lines and hardmask lines.

In one embodiment, forming the grating structure includes using a pitch halving or pitch quartering processing scheme.

In one embodiment, forming the mask above the grating structure includes exposing areas larger than the select regions of the hardmask layer exposed by the grating structure.

In one embodiment, removing the select regions of the hardmask layer is performed using an etch process selective to the dielectric lines of the metallization structure and selective to the grating structure.

In an embodiment, a method of fabricating an interconnect structure for a semiconductor die includes forming a lower metallization layer including alternating metal lines and dielectric lines above a substrate, the dielectric lines raised above the metal lines. The method also includes forming a first hardmask layer on every other of the metal lines of the lower metallization layer, between and co-planar with the dielectric lines of the lower metallization layer. The method also includes forming a second hardmask layer on remaining ones of the metal lines of the lower metallization layer, between and co-planar with the dielectric lines of the lower metallization layer. The method also includes forming a first grating structure above and orthogonal to the alternating metal lines and dielectric lines of the lower metallization layer. The method also includes forming a first via mask above the first grating structure, the first via mask exposing first select regions of the first hardmask layer exposed by the first grating structure. The method also includes removing the first select regions of the first hardmask layer to expose first select regions of the every other of the metal lines of the lower metallization layer. The method also includes forming a second via mask above the first grating structure, the second via mask exposing first select regions of the second hardmask layer exposed by the first grating structure. The method also includes removing the first select regions of the second hardmask layer to expose first select regions of the remaining ones of the metal lines of the lower metallization layer. The method also includes forming a second grating structure above and orthogonal to the alternating metal lines and dielectric lines of the lower metallization layer. The method also includes forming a third via mask above the second grating structure, the third via mask exposing second select regions of the first hardmask layer exposed by the second grating structure. The method also includes removing the second select regions of the first hardmask layer to expose second select regions of the every other of the metal lines of the lower metallization layer. The method also includes forming a fourth via mask above the second grating structure, the fourth via mask exposing second select regions of the second hardmask layer exposed by the second grating structure. The method also includes removing the second select regions of the second hardmask layer to expose second select regions of the remaining ones of the metal lines of the lower metallization layer. The method also includes forming metal vias on the first and second select regions of the every other of the metal lines of the lower metallization layer and on the first and second select regions of the remaining ones of the metal lines of the lower metallization layer.

In one embodiment, removing the first select regions of the first hardmask layer, removing the first select regions of the second hardmask layer, removing the second select regions of the first hardmask layer, and removing the second select regions of the second hardmask layer includes selecting via locations.

In one embodiment, forming the first grating structure above and orthogonal to the alternating metal lines and dielectric lines of the lower metallization layer includes exposing half of all possible via locations above the lower metallization layer, and forming the second grating structure above and orthogonal to the alternating metal lines and dielectric lines of the lower metallization layer includes exposing a remaining half of all possible via locations above the lower metallization layer.

In one embodiment, the method further includes, prior to forming the first via mask above the first grating structure, forming a first plug mask above the first grating structure and removing first uppermost portions of the first hardmask layer, the second hardmask layer and the dielectric lines exposed by the first grating structure to form first upper metal line locations above and orthogonal to the metal lines of the lower metallization layer, and prior to forming the third via mask above the second grating structure, forming a second plug mask above the second grating structure and removing second uppermost portions of the first hardmask layer, the second hardmask layer and the dielectric lines exposed by the second grating structure to form second upper metal line locations above and orthogonal to the metal lines of the lower metallization layer.

In one embodiment, the method further includes removing the first plug mask prior to forming the first via mask above the first grating structure and removing the second plug mask prior to forming the third via mask above the second grating structure.

In one embodiment, the method further includes forming metal lines in the first and second upper metal line locations.

In one embodiment, the method further includes forming a structure of alternating dielectric lines and first and second hardmask lines above the metal lines formed in the first and second upper metal line locations, the structure of alternating dielectric lines and first and second hardmask lines parallel with a direction of the metal lines formed in the upper metal line locations and orthogonal to the alternating metal lines and dielectric lines of the lower metallization layer.

In one embodiment, the method further includes forming an additional metallization layer using the structure of alternating dielectric lines and first and second hardmask lines.

In one embodiment, forming the additional metallization layer includes using a circular flow.

In one embodiment, forming the first via mask above the first grating structure includes exposing areas larger than the first select regions of the first hardmask layer exposed by the first grating structure.

In one embodiment, removing the first select regions of the first hardmask layer is performed using an etch process selective to the dielectric lines of the metallization structure and selective to the first grating structure.

In an embodiment, a starting structure for fabricating an upper metallization layer of an interconnect structure for a semiconductor die includes a lower metallization layer including alternating metal lines and dielectric lines above a substrate, the dielectric lines raised above the metal lines. A first hardmask layer is disposed on every other of the metal lines of the lower metallization layer, between and co-planar with the dielectric lines of the lower metallization layer. A second hardmask layer is disposed on remaining ones of the metal lines of the lower metallization layer, between and co-planar with the dielectric lines of the lower metallization layer. The second hardmask layer is composed of a material different from a material of the first hardmask layer.

In one embodiment, the first hardmask layer includes silicon carbide, and the second hardmask layer includes silicon oxide.

In one embodiment, the dielectric lines include silicon nitride.

In one embodiment, the first hardmask layer and the second hardmask layer have different etch rates from one another.

What is claimed is:

1. A method of fabricating an interconnect structure for a semiconductor die, the method comprising:
    forming a lower metallization layer comprising alternating metal lines and dielectric lines above a substrate, the dielectric lines raised above the metal lines;
    forming a hardmask layer on the metal lines of the lower metallization layer, between and co-planar with the dielectric lines of the lower metallization layer;
    forming a grating structure above and orthogonal to the alternating metal lines and dielectric lines of the lower metallization layer;
    forming a mask above the grating structure, the mask exposing select regions of the hardmask layer exposed by the grating structure;
    removing the select regions of the hardmask layer to expose select regions of the metal lines of the lower metallization layer; and
    forming metal vias on the select regions of the metal lines of the lower metallization layer.

2. The method of claim 1, wherein removing the select regions of the hardmask layer to expose the select regions of the metal lines of the lower metallization layer comprises selecting via locations.

3. The method of claim 1, wherein forming the grating structure above and orthogonal to the alternating metal lines and dielectric lines of the lower metallization layer comprises exposing all possible via locations above the lower metallization layer.

4. The method of claim 1, further comprising:
    prior to forming the mask above the grating structure, forming a plug mask above the grating structure, the plug mask exposing select regions of the hardmask layer and the dielectric lines exposed by the grating structure; and removing uppermost portions of the select regions of the hardmask layer and the dielectric lines exposed by the grating structure to form upper metal line locations above and orthogonal to the metal lines of the lower metallization layer.

5. The method of claim 4, further comprising:
removing the plug mask prior to forming the mask above the grating structure.

6. The method of claim 4, further comprising:
forming metal lines in the upper metal line locations at substantially the same time as forming the metal vias on the select regions of the metal lines of the lower metallization layer.

7. The method of claim 6, further comprising:
forming a structure of alternating dielectric lines and hardmask lines above the metal lines formed in the upper metal line locations, the structure of alternating dielectric lines and hardmask lines parallel with a direction of the metal lines in the upper metal line locations and orthogonal to the alternating metal lines and dielectric lines of the lower metallization layer.

8. The method of claim 7, further comprising:
forming an additional metallization layer using the structure of alternating dielectric lines and hardmask lines.

9. The method of claim 1, wherein forming the grating structure comprising using a pitch halving or pitch quartering processing scheme.

10. The method of claim 1, wherein forming the mask above the grating structure comprises exposing areas larger than the select regions of the hardmask layer exposed by the grating structure.

11. The method of claim 10, wherein removing the select regions of the hardmask layer is performed using an etch process selective to the dielectric lines of the lower metallization layer and selective to the grating structure.

12. A method of fabricating an interconnect structure for a semiconductor die, the method comprising:
forming a lower metallization layer comprising alternating metal lines and dielectric lines above a substrate, the dielectric lines raised above the metal lines;
forming a first hardmask layer on every other of the metal lines of the lower metallization layer, between and co-planar with the dielectric lines of the lower metallization layer;
forming a second hardmask layer on remaining ones of the metal lines of the lower metallization layer, between and co-planar with the dielectric lines of the lower metallization layer;
forming a first grating structure above and orthogonal to the alternating metal lines and dielectric lines of the lower metallization layer;
forming a first via mask above the first grating structure, the first via mask exposing first select regions of the first hardmask layer exposed by the first grating structure;
removing the first select regions of the first hardmask layer to expose first select regions of the every other of the metal lines of the lower metallization layer;
forming a second via mask above the first grating structure, the second via mask exposing first select regions of the second hardmask layer exposed by the first grating structure;
removing the first select regions of the second hardmask layer to expose first select regions of the remaining ones of the metal lines of the lower metallization layer;
forming a second grating structure above and orthogonal to the alternating metal lines and dielectric lines of the lower metallization layer;
forming a third via mask above the second grating structure, the third via mask exposing second select regions of the first hardmask layer exposed by the second grating structure;
removing the second select regions of the first hardmask layer to expose second select regions of the every other of the metal lines of the lower metallization layer;
forming a fourth via mask above the second grating structure, the fourth via mask exposing second select regions of the second hardmask layer exposed by the second grating structure;
removing the second select regions of the second hardmask layer to expose second select regions of the remaining ones of the metal lines of the lower metallization layer; and
forming metal vias on the first and second select regions of the every other of the metal lines of the lower metallization layer and on the first and second select regions of the remaining ones of the metal lines of the lower metallization layer.

13. The method of claim 12, wherein removing the first select regions of the first hardmask layer, removing the first select regions of the second hardmask layer, removing the second select regions of the first hardmask layer, and removing the second select regions of the second hardmask layer comprises selecting via locations.

14. The method of claim 12, wherein forming the first grating structure above and orthogonal to the alternating metal lines and dielectric lines of the lower metallization layer comprises exposing half of all possible via locations above the lower metallization layer, and wherein forming the second grating structure above and orthogonal to the alternating metal lines and dielectric lines of the lower metallization layer comprises exposing a remaining half of all possible via locations above the lower metallization layer.

15. The method of claim 12, further comprising:
prior to forming the first via mask above the first grating structure, forming a first plug mask above the first grating structure;
removing first uppermost portions of the first hardmask layer, the second hardmask layer and the dielectric lines exposed by the first grating structure to form first upper metal line locations above and orthogonal to the metal lines of the lower metallization layer;
prior to forming the third via mask above the second grating structure, forming a second plug mask above the second grating structure; and
removing second uppermost portions of the first hardmask layer, the second hardmask layer and the dielectric lines exposed by the second grating structure to form second upper metal line locations above and orthogonal to the metal lines of the lower metallization layer.

16. The method of claim 15, further comprising:
removing the first plug mask prior to forming the first via mask above the first grating structure; and
removing the second plug mask prior to forming the third via mask above the second grating structure.

17. The method of claim 15, further comprising:
forming metal lines in the first and second upper metal line locations.

18. The method of claim 17, further comprising:
forming a structure of alternating dielectric lines and first and second hardmask lines above the metal lines formed in the first and second upper metal line locations, the structure of alternating dielectric lines and first and second hardmask lines parallel with a direction of the metal lines formed in the first and second upper metal line locations and orthogonal to the alternating metal lines and dielectric lines of the lower metallization layer.

19. The method of claim 18, further comprising:
forming an additional metallization layer using the structure of alternating dielectric lines and first and second hardmask lines.

20. The method of claim 19, wherein forming the additional metallization layer comprises using a circular flow.

21. The method of claim 12, wherein forming the first via mask above the first grating structure comprises exposing areas larger than the first select regions of the first hardmask layer exposed by the first grating structure.

22. The method of claim 21, wherein removing the first select regions of the first hardmask layer is performed using an etch process selective to the dielectric lines of the lower metallization layer and selective to the first grating structure.

23. An integrated circuit structure comprising:
a lower metallization layer comprising alternating metal lines and dielectric lines above a substrate, the dielectric lines raised above the metal lines, wherein the dielectric lines have a homogeneous composition;
a first hardmask layer disposed on every other of the metal lines of the lower metallization layer, between and co-planar with the dielectric lines of the lower metallization layer; and
a second hardmask layer disposed on remaining ones of the metal lines of the lower metallization layer, between and co-planar with the dielectric lines of the lower metallization layer, wherein the second hardmask layer comprises a material different from a material of the first hardmask layer.

24. The integrated circuit structure of claim 23, wherein the first hardmask layer comprises silicon carbide, and the second hardmask layer comprises silicon oxide.

25. The integrated circuit structure of claim 24, wherein the dielectric lines comprise silicon nitride.

* * * * *